United States Patent
Uchihiro et al.

(10) Patent No.: US 7,147,746 B2
(45) Date of Patent: Dec. 12, 2006

(54) PREPARING METHOD OF IC CARD AND IC CARD

(75) Inventors: Shinji Uchihiro, Tokyo (JP); Ryoji Hattori, Iruma (JP)

(73) Assignee: Konica Corporation (JP)

( * ) Notice: Subject to any disclaimer, the term of this patent is extended or adjusted under 35 U.S.C. 154(b) by 364 days.

(21) Appl. No.: 10/418,645

(22) Filed: Apr. 17, 2003

(65) Prior Publication Data

US 2003/0205399 A1    Nov. 6, 2003

(30) Foreign Application Priority Data

Apr. 23, 2002 (JP) ............................. 2002-120223

(51) Int. Cl.
*C09J 5/06* (2006.01)
(52) U.S. Cl. ...................... 156/325; 438/118
(58) Field of Classification Search ................ 156/325, 156/302, 303; 100/194, 195
See application file for complete search history.

(56) References Cited

U.S. PATENT DOCUMENTS 4,194,618 A * 3/1980 Malloy ...................... 206/205

6,404,643 B1 * 6/2002 Chung ........................ 361/737

FOREIGN PATENT DOCUMENTS

JP    2000036026 A  *  2/2000

OTHER PUBLICATIONS

Translation of JP-2000-36026A.*

* cited by examiner

*Primary Examiner*—Richard Crispino
*Assistant Examiner*—Chris Schatz
(74) *Attorney, Agent, or Firm*—Cantor Colburn LLP

(57) ABSTRACT

A method of preparing an IC card, which comprises a first sheet material and a second sheet material and an adhesive agent layer between the first sheet material and the second sheet material, the adhesive agent layer having therein an IC module fixed with a moisture hardenable adhesive agent, the method comprising: a pasting step to paste the first sheet material and the second sheet material while providing the IC module between the first sheet material and the second sheet material with the moisture hardenable adhesive agent to form a pasted sheet; a first storing step to store the pasted sheet under a temperature of 10 to 30° C. and a relative humidity of 20 to 80%; and a second storing step to store the pasted sheet under a temperature of 20 to 50° C. and a relative humidity of 40 to 100% after the first storing step.

24 Claims, 7 Drawing Sheets

PREPARING METHOD OF IC CARD AND IC CARD

TECHNICAL FIELD

The invention relates to a method of preparing a non-contact type integrated circuit (IC) card and an IC card prepared by the method.

BACKGROUND

Recently, identification cards such as a cash card, an employee identification card, a member card, a student identification card, a foreigner registration certificate card and a driver's license card have become wide spread. An IC module is built-into the identification card. The card is generally prepared by, for example, a method in which an inlet having a circuit base plate having thereon an IC chip and an antenna is inserted between two sheets of Polyethylene terephthalate (PET) film, and the sheets are pasted together by a moisture-hardening type adhesive agent, UV-hardening type adhesive agent or a two-part liquid mixture type adhesive agent, and then punched into a shape of the card.

It is required that the pasting by the adhesive agent is carried out under a relatively high temperature from the viewpoint of the conveyance suitability of a card substrate due to a shrinkage and bending of the support (referred to as a sheet material in the present invention). Accordingly, moisture-hardening adhesive agents are preferably used among the adhesive agents capable of adhering at low temperature.

However, the majority of the moisture-hardening type adhesive agents require a relatively long period for complete hardening.

The reaction can be accelerated by putting the pasted sheets into a high temperature and high moisture environment resulting in a shortening of the hardening time. However, a problem of the formation of a bulge in the card, caused by the generation of carbon dioxide gas, may result.

Further, the pasted sheets are frequently stored in a stacked state, which preserves space over arranging the sheets all in one plane.

A problem of sheet deformity is raised when the sheets are stacked since the surface of the sheets have irregularities caused by the presence of the IC chip in the sheet.

Furthermore, the reaction speed is slowed since moisture can have difficultly entering into the pasted sheets when the sheets are stacked. Besides, in cases where pasted sheets are cut into a card shape, the adhesive agents, which become hard and hardly extendable after hardening, are preferable since cards having a smooth cut portion can be obtained. The adhesive agent having a low rupture extensibility is very easily handled.

However, in such cases, the card tends to be breakable in normal use since the whole card is made hard. Accordingly, the card is easily broken when the card is put into the back pocket of trousers worn by a man and the man changes his posture since a high stress is loaded to the card under this condition. On the other hand, when an adhesive agent having a large rupture extensibility after hardening is used, the sheet become softer, however the sheet is difficult to punch into the card shape resulting in a lower production efficiency. Additionally scraps of the extended adhesive agent adhere to the edges of the card, preventing the card from conveying properly in the to the next printing process and the lamination process, for example, resulting in problems for the manufacturing process. An improvement to the process is therefore desired.

SUMMARY

The invention has been made based on the above-mentioned background. Embodiments of the invention may provide a method of preparing an IC card in which the hardening period of the adhesive agent is shortened. Another embodiment of the invention may provide a method of preparing an IC card in which the hardening and cutting processes can be easily performed, no distortion is formed, and the durability of the product after shaped as a card is high and the card has high conveyance suitability; and to provide an IC card prepared by utilizing the method.

The above-mentioned aspects can be achieved by the following embodiments.

An embodiment of the invention is a method of preparing an IC card, which comprises a first sheet material and a second sheet material and an adhesive agent layer between the first sheet material and the second sheet material, the adhesive agent layer having therein an IC module fixed with a moisture hardenable adhesive agent. The preparing method comprises a pasting step to paste the first sheet material and the second sheet material while providing the IC module between the first sheet material and the second sheet material with the moisture hardenable adhesive agent to form a pasted sheet. The method further comprising a first storing step to store the pasted sheet under a circumstance having a temperature of 10 to 30° C. and a relative humidity of 20 to 80% for 3 to 72 hours after pasting; and a second storing step to store the pasted sheet under a circumstance having a temperature of 20 to 50° C. and a relative humidity of 40 to 100% after the first storing step.

In the method, it is preferable that, in the second storing step, the pasted sheet is stored under a circumstance having a temperature of 35 to 50° C. and a relative humidity of 60 to 100%.

In the method, it is preferable that a rupture extensibility of the moisture hardenable adhesive agent in a completely hardened state is 200 to 1000%.

In the method, it is preferable that, in the pasting step, the plurality of pasted sheets are prepared, and at least in the first storing step or the second storing step, the plurality of pasted sheets are stacked together, and at least one kind of separating sheets, which are made of paper, non-woven fabric or metal, are interrupted between the stacked pasted sheets.

In the method, it is preferable that at least the separating sheets, which are made of paper or non-woven fabric, are interrupted between the stacked pasted sheets at intervals of 1 to 10 of the pasted sheets.

In the method, it is preferable that each of the separating sheets comprises water in an amount of 0.001 to 50 g/m².

In the method, it is preferable that at least the separating sheets, which are made of metal, are interrupted between the stacked sheets at intervals of 10 to 400 of the pasted sheets.

In the method, it is preferable that the metal is stainless, aluminum, or copper.

In the method, it is preferable that a load on each of the stacked pasted sheets is 2 to 250 kg/m².

In the method, it is preferable that the method further comprises a cutting step to cut the pasted sheet, and a rupture extensibility of the moisture hardenable adhesive agent is 50 to 500% when the cutting step is conducted.

In the method, it is preferable that the method further comprises a cutting step to cut the pasted sheet, and an elastic modulus of the moisture hardenable adhesive agent is 3 to 18 kgf/mm² when the cutting step is conducted.

In the method, it is preferable that the method further comprises a cutting step to cut the pasted sheet, and a peel-strength between the first sheet material and the adhesive agent layer and a peel-strength between the second sheet material and the adhesive agent layer are each not less than 1500 g per 25 mm width when the cutting step is conducted.

In the method, it is preferable that a total period of the first storing method and the second storing method is 1 to 60 days.

In the method, it is preferable that an elastic modulus of the moisture hardenable adhesive agent in completely hardened state is 5 to 50 kgf/mm².

In the method, it is preferable that a viscosity of the moisture hardenable adhesive agent is not more than 30,000 mps.

In the method, it is preferable that the moisture hardenable adhesive agent comprises a polymer containing a silane coupler or an urethane polymer having an isocyanate group in at least one end of the molecule.

In the method, it is preferable that the moisture hardenable adhesive agent comprises the urethane polymer having an isocyanate group in at least one end of the molecule.

In the method, it is preferable that the method further comprises a cutting step to cut the pasted sheet, and a proportion of number of reacted isocyanate groups to initial number of isocyanate groups in the moisture hardenable adhesive agent is 50 to 90% when the cutting step is conducted.

In the method, it is preferable that the method further comprising a cutting step to cut the pasted sheet into small pieces of the pasted sheet, and a punching step for punching the small pieces of the pasted sheet into a card shape to prepare a card substrate.

Another embodiment of the invention is an IC card prepared by the above-described method.

PREFERRED EMBODIMENTS OF THE INVENTION

Figure 1:
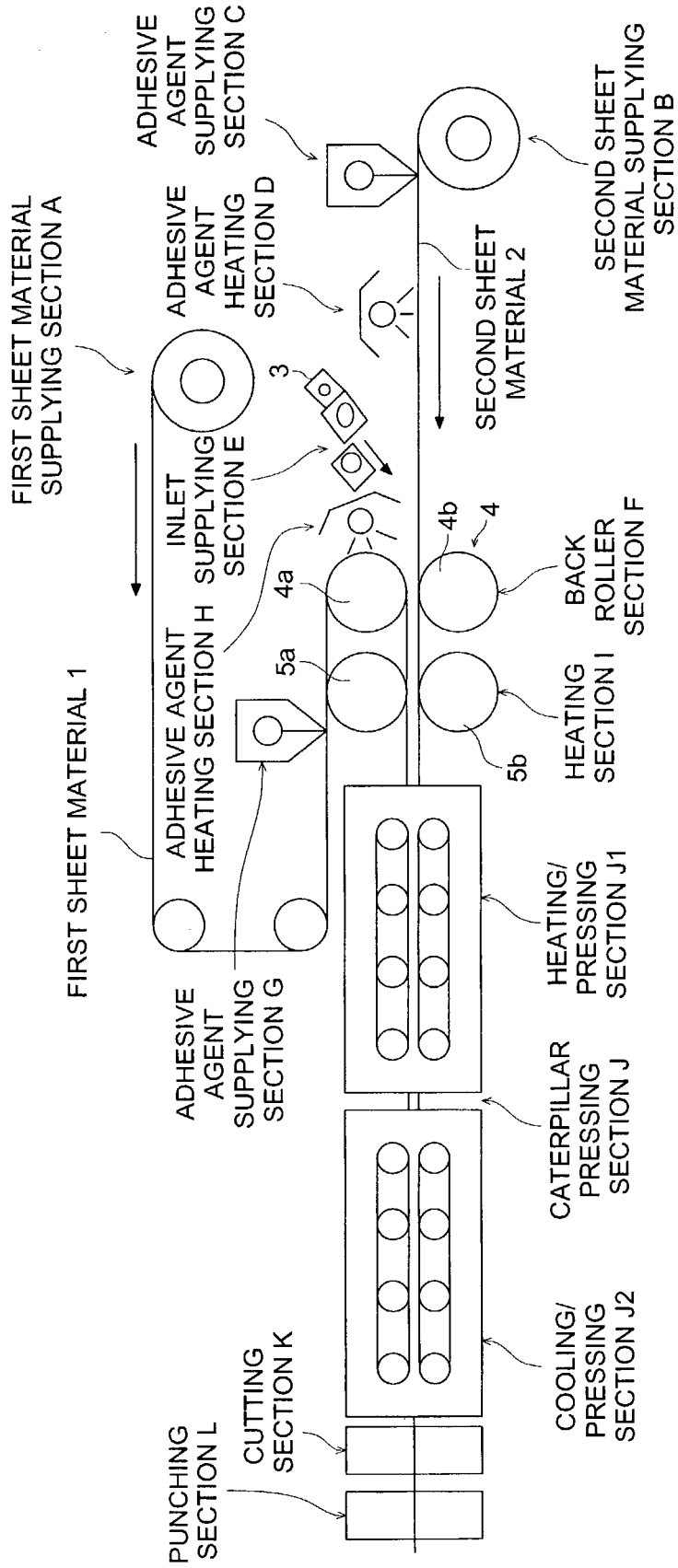
FIG. 1 is a schematic drawing of the constitution of the method of preparing the IC card.

Embodiments of the method of preparing the IC card and the IC card according to the invention are described below referring to the drawings. However, the invention is not limited to the embodiments shown below.

FIG. 1 shows a schematic drawing of the constitution of the method of preparing the IC card.

In this IC card preparing method, the first sheet material (back side sheet material) 1 in a shape of a rolled long sheet is set at a first sheet material supplying section A, and the second sheet material (surface side sheet material) 2 in a shape of a rolled long sheet is set at a second sheet material supplying section B. The adhesive agent is supplied from the adhesive agent supplying section C and coated onto the second sheet material and heated by a adhesive heating means D, and the sheet is conveyed to the inlet supplying section E.

Inlet 3 containing the IC module 3 having an IC chip and an antenna, is supplied at the inlet supplying section E and set onto the prescribed position of the second sheet material 2, and then the second sheet material is conveyed to the position of a back roller section F.

The first sheet material 1 is coated with the adhesive agent supplied from an adhesive agent supplying section G and heated at the adhesive agent heating section H, and then conveyed to the back roller section F.

The back roller section F has a thermally controllable laminating roller 4b and a counter roller 4a, and the first sheet material 1 and the second sheet material 2 are pasted together by using the laminating rollers 4a and 4b. The temperature difference between the pair rollers 4a and 4b is from 0° C. to 100° C. In this embodiment, the second sheet material 2 has the image receiving layer and the first sheet material 1 has the writable layer; regarding the pair rollers 4a and 4b, the temperature of the image receiving layer side roller is lower than that of the writable layer side roller.

A heating section I is arranged after the back roller section F, and the sheets materials pasted in the back roller section F are heated by a pair of rollers 5a and 5b. Thus, the adhesive agent coated on the sheet material before the pasting of the first sheet material 1 and the second sheet material 2 is re-heated and the pasted sheet is conveyed to the caterpillar pressing section J.

The caterpillar pressing section J is arranged on the line behind roller section F and the heating section I for pasting. The caterpillar pressing section J has a heating pressing section J1 and cooling pressing section J2 and the pasted sheet is pressed while heating and then pressed while cooling. The pasted sheet is conveyed into a cutting section K after the press with heating and the press with cooling. The pasted sheet is cut into a sheet leaf in the cutting section K, and then conveyed into a punching section L for punching into a card form. A format is printed on one of the first sheet material 1 and the second sheet material 2 before the punching for forming the card form.

The easiness of handling and the punching precision are improved by cutting the pasted sheet into a sheet leaf before the punching into the card form. The easiness of handling and the printing precision of the format are improved by printing the format before the punching into the card form.

Figure 2:
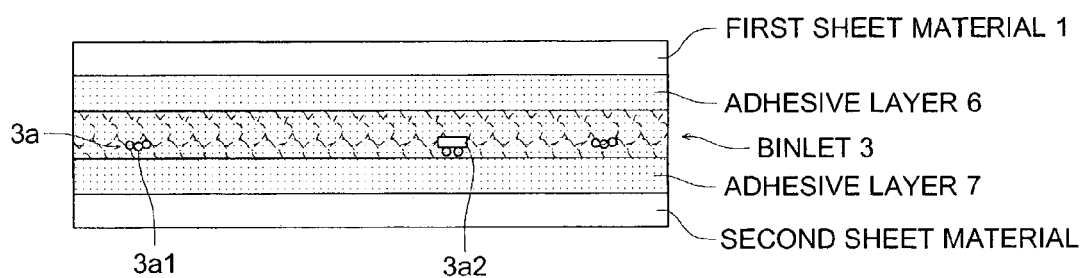
FIG. 2 shows a cross-section of the image forming member constituted by the pasted IC card.

FIG. 2 shows a cross-sectional view of the pasted sheet. The pasted sheet has an electronic parts 3a having a prescribed thickness between the first sheet material 1 and the second sheet material 2. The electronic parts 3a have an antenna 3a1 and an IC chip 3a2. The IC module of the electronic parts 3a is included in the inlet 3. The pasted sheet has a laminated layer structure which is constituted by arranging the inlet 3 between the first sheet material 1 and the second sheet material 2 and pasted through adhesive agent layers 6 and 7.

The image receiving layer is provided on at least one of the first sheet material 1 and the second sheet material 2. The personal discriminating information including the name and portrait image is formed on the image receiving layer by the thermal transfer method or the ink-jet method. The writable layer is provided at a part of that.

The transparent protective layer is provided on the surface on which the personal discriminating information is provided. The transparent protective layer is composed of an actinic ray curable resin.

The IC chip is not positioned overlapping with the portrait image. The IC card has the parts including the IC module, and is non-contact type. The irregularity of the flatness of the surface sheet around the chip is not more than ±10 μm, thus the flatness of the IC card is improved.

In this embodiment of the invention, the adhesive agent to be used for pasting the first sheet material 1 and the second sheet material 2 is a moisture hardening adhesive agent.

The back roller section F for pasting the first sheet material 1 and the second sheet material 2 has the temperature controlling mechanism; and the temperature of the pair rollers 4a and 4b is preferably from 40° C. to 90° C. Carbon dioxide gas can be driven out from the adhesive agent so as to inhibit the formation of the bulge by controlling the temperature into the above-mentioned range.

As the method for controlling the temperature, a method by electrically heating the rollers, a method by blowing hot air into the roller and a method by circulating temperature controlled liquid in the rollers are usable, and a method by circulating warm water is preferable since such the method is simple. The temperature range of from 60° C. to 90° C. is more preferable.

Moreover, a heating device for re-heating before the pasting of the coated adhesive agent with the other side sheet is preferably provided for preventing the lowering of the temperature of the coated adhesive agent. Therefore, a heating member for heating the sheet pasting section from outside is provided, and the coated adhesive agent is heated at the adhesive agent heating section H heated by this heating member. The heating temperature is preferably from 50° C. to 120° C., more preferably from 60° C. to 120° C. Carbon dioxide gas can be driven out from the adhesive agent and the occurrence of the bulge can be prevented by the heating.

The adhesive agent can be coated and the hardening of the adhesive agent is progressed on the occasion of the lamination even when the humidity and the temperature of the environment are not controlled. However, when a moisture hardening type adhesive agent is used, the hardening speed of the hardening agent is raised and the complete hardening of the adhesive agent is accelerated by performing the operation in the environment so as to give the temperature and the humidity at on the occasion of the production. The environment of the production is preferably a temperature of from 20° C. to 50° C. and a humidity of from 70% to 100%.

The sheet coated with the adhesive agent and pasted is stored until the adhesive agent is hardened.

After about 3 days, the peeling strength between the sheets is attained until 1,500 g/2.5 cm so that the sheet is not deformed or bended even when the sheet is carried or cut. Thereafter, the adhesive agent is completely hardened spending for one to four weeks.

The progress of the hardening of the adhesive agent can be accelerated by the following method. The period for completely hardening can be reduced to a half or less when the sheet is stored after lamination for a period of from 3 hours to 72 hours at a temperature of from 10° C. to 30° C. and a humidity of from 20% to 80% for initial hardening, and then further stored in the environment of a temperature of from 20° C. to 50° C., preferably 35° C. to 50° C., and a humidity of from 40% to 100%, preferably 60% to 100%.

The reaction is excessively accelerated or the initial hardening is made insufficient so as to form the bulges on the sheet when the temperature, humidity and the storage period is without the foregoing range.

As above-mentioned, in this embodiment of the invention, the IC module is provided in the adhesive agent layers 6 and 7 being between the first sheet material 1 and the second sheet material 2. After the pasting of the first sheet material 1 and the second sheet material 2, thus, after the cutting at the cutting zone K, the pasted sheet is stored in the predetermined circumstance and then conveyed to the punching zone L to be punched into the card form.

The hardening speed of the adhesive agent is raised and the complete hardening of the adhesive agent is accelerated, the hardening and cutting process are easily performed, the distortion is not occurred, the durability of the product after shaped as the card, and the mechanical conveyance suitability of the card is made high by storing the pasted sheet under the foregoing predetermined temperature and humidity.

In particular, after the pasting of the first sheet material 1 and the second sheet material 2, namely after the cutting at the cutting zone K, the pasted sheet is stored for 3 hours to 70 hours in the environment of a temperature of from 10° C. to 30° C. and a humidity of from 20% to 80% and then further stored at a temperature of from 35° C. to 50° C. and a humidity of from 60% to 100%. Thereafter the sheet is conveyed to the punching zone to be punched into the card form.

The hardening speed of the adhesive agent is raised and the complete hardening of the adhesive agent is accelerated, the hardening and cutting process are easily performed, the distortion is not occurred, the durability of the product after shaped as the card, and the mechanical conveyance suitability of the card is made high by storing the pasted sheet under the foregoing predetermined temperature and humidity.

Figure 3:
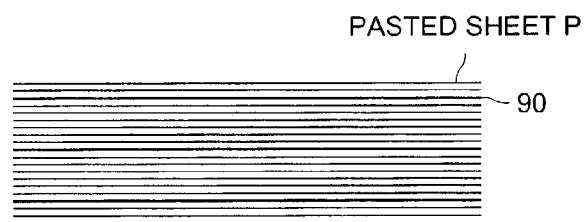
FIG. 3 shows the storing status of the pasted sheet.

After cutting in the cutting section K, the pasted sheets P are piled as shown in FIG. 3, and an interrupt sheet 90 made from at least one of nonwoven fabric, paper and metal is inserted between the stacked sheets P. Thus a space is formed between the sheets P so that the moisture is easily entered. Consequently, the hardening speed of the adhesive agent is raised and the completely hardening is accelerated, and the irregularity of the sheet surface can be canceled.

The many pasted sheets after lamination are stacked during the storage. When the size of the pasted sheet is large, moisture is difficult to supply to the sheet placed at the bottom of the stack. The non-woven fabric or paper is preferably inserted between the pasted sheets since the moisture is easily passed when a space is formed between the sheets. The flatness irregularity occurred in the sheets themselves can be absorbed and the sheets can be vertically stacked without any slant.

The inserting interval of the non-woven fabric or the paper in the stack of the sheets P is preferably from 1 to 10 sheets. The space is formed so that the moisture can be easily passed, and the hardening speed of the adhesive agent is raised and the complete hardening is accelerated by specifying the interval of the nonwoven fabric or the paper to be inserted between the pasted sheets.

It is preferable that the nonwoven fabric or the paper contains moisture in an amount of from 0.001 g to 50 g per square meter. The hardening speed of the adhesive agent is raised and the complete hardening is accelerated by that the nonwoven fabric or the paper contains moisture and the moisture content is specified.

The interval of the metal plates inserted in the pile of the sheets P is preferably from 10 sheets to 400 sheets. The irregularity of flatness of the sheet surface can be canceled by specifying the interval of the metal plates to be inserted between the sheets P.

The irregularity of the flatness of the pasted sheet is caused by the presence of the circuit and the IC chip therein. Therefore, it is difficult to vertically stack the sheets. The irregularity of the sheet surface can be canceled and the sheets can be vertically stacked without bending by inserting the metal plates, which are a plate with strength, to every several sheets. The interval of the metal plates is preferably from 10 sheets to 400 sheets, more preferably from 20 sheets to 200 sheets.

It is necessary to apply some degree of load to the sheets during the storage for reinforcing the contact of the pasted two sheet materials since the adhesive agent in the pasted sheet just after the lamination is not completely hardened. When the load is excessively applied, there is the possibility of occurring of distortion of the sheet and occurring damage of the IC chip being in the interior of the pasted sheet.

The material of the metal plate is preferably stainless steel, aluminum or copper; and the irregularity can be canceled by applying the designated load. The by the stack is preferably from 2 kg/m$^2$ to 2,500 kg/m$^2$, more preferably from 2 kg/m$^2$ to 1,500 kg/m$^2$ per sheet. The irregularity of the sheet surface can be canceled by specifying the load applied per sheet.

In an embodiment of the invention, the adhesive agent to be used for pasting the first sheet material 1 and the second sheet material 2 is a moisture hardening type adhesive agent; the pasted sheet is preferably stored for 1 to 60 days and cut before the complete hardening of the adhesive agent. By such the procedure, the hardening and the cutting of the sheet can be easily performed without occurring of the distortion and the card having high durability and high mechanical conveyance suitability can be obtained.

The rupture extensibility of the adhesive agent after complete hardening is preferably from 200% to 1,000%. The hardening and the cutting of the sheet can be easily performed without occurring of the distortion and the card having high durability can be obtained by specifying the breaking elongation degree on the occasion of the completely hardened adhesive agent.

The rupture extensibility on the occasion of cutting in the cutting zone K is preferably from 50% to 500%. The hardening and the cutting of the sheet can be easily performed without occurring of the distortion and the card having high durability can be obtained by specifying the rupture extensibility on the occasion of cutting.

When the adhesive agent is pulled with a constant velocity, the adhesive agent is broken at a point depending on the property of the adhesive agent. The rupture extensibility of the adhesive agent is an extended ratio of the adhesive agent at the breaking point. More particularly the rupture extensibility in an embodiment of the present invention can be calculated by the following equation.

$$\text{Rupture Extensibility}(\%) = (Lru - Lr0)/Lr0 \times 100$$

In the equation, Lru represents a length of the sample of the adhesive agent when the sample breaks (ruptures): Lr0 represents a length of the sample of the adhesive agent before extended. In an embodiment of the present invention, the rupture extensibility is measured under a temperature of 23° C. and a relative humidity of 55%. Usually, the adhesive agent having a low breaking elongation degree is easily cut by a scissors-like cutlery, and the adhesive agent having a high rupture extensibility is disadvantageous since such the adhesive agent is difficultly cut by the scissors-like cutlery because the elongation of the adhesive agent until cutting off of the adhesive agent.

Besides, the adhesive agent having the high rupture extensibility is advantageous for the use as a part of the card substrate since such the adhesive agent having a high rupture extensibility is preferable when the card is bended or folding since such the adhesive agent has high softness. It is ideal that the breaking elongation is high on the occasion of the cutting and is low after the completion of the hardening. The range of the rupture extensibility on the occasion of the cutting is preferably from 5% to 500%, more preferably from 50% to 400%. The rupture extensibility after completion of the hardening is preferably from 200% to 1,000%, more preferably from 250% to 950%.

The elastic modulus of the adhesive agent on the occasion of the cutting is preferably from 3 kgf/mm$^2$ to 18 kgf/mm$^2$. The hardening and the cutting of the sheet can be easily performed without occurring of the distortion and the card having high durability can be obtained by specifying the elastic modulus of the adhesive agent.

The elastic modulus of the completely hardened adhesive agent is preferably from 5 kgf/mm$^2$ to 50 kgf/mm$^2$. The hardening and the cutting of the sheet can be easily performed without occurring of the distortion and the card having high durability can be obtained by specifying the elastic modulus of the completely hardened adhesive agent.

When the adhesive agent comprises an urethane polymer having an isocyanate group at the end of the molecule, the ratio of number of reacted isocyanate groups to initial number of isocyanate group in the adhesive agent on the occasion of the cutting is preferably from 50% to 90%. The hardening and the cutting of the sheet can be easily performed without occurring of the distortion and the card having high durability can be obtained by specifying the ratio of reacted isocyanate group in the adhesive agent on the occasion of the cutting.

The peeling strength of the sheet pasted by the adhesive agent on the occasion of the cutting is preferably not less than 1,500 g per 25 mm width. The hardening and the cutting of the sheet can be easily performed without occurring of the distortion and the card having high durability can be obtained by specifying the peeling strength between the pasted sheets.

The viscosity of the adhesive agent is preferably not less than 30,000 mps at 130° C. The flatness of the sheet can be improved without degradation of the coating ability of the adhesive agent, and the problems of lowering of the surface strength of the card after the hardening of the adhesive agent and the occurrence of burrs and whiskers are solved by the use of the adhesive agent having such the viscosity.

A punching die type cutting edge and a hollow cutting edge can be used in the punching section L. As the punch-die type punching device, a pair of a punch and a die having an edge angle of 90° is used. The hollow cutting edge is an edge for punching the sheet from the upper direction; the edge having an edge angle of 28° is used in the embodiment. The hollow edge can punch the sheet with any rupture extensibility since the edge has an acute angle, but such the edge is inferior to the punch-die type punching edge in the durability. Besides, the edge of the punching die is suitable for punching a lot of sheets since the structure thereof is simple but the sheet with a high breaking elongation degree is difficultly punched by such the edge.

(Adhesive Agent for Preparing the IC Card)

In an embodiment of the invention, moisture hardenable adhesive agents are used. As the moisture hardenable adhesive agents, adhesive agents comprising a polymer containing a silane coupler or a urethane polymer having an isocyanate group in the end of the molecule as a hardening component are preferably used. Especially, the adhesive agent comprising the urethane polymer having an isocyanate group is preferably used in an embodiment of the invention.

The moisture hardenable adhesive agents (referred to as reactive type hot-melt adhesive agents) are disclosed in Japanese Patent Publication Open to Public Inspection, hereinafter referred to as JP O.P.I. Publication, Nos. 2000-036026, 2000-219855 and 2000-211278, and Japanese Patent Application No. 2000-369855. Any of these adhesive agents are usable without any limitation as long as the adhesion can be performed at a low temperature. The thickness of the adhesive agent layer including the electronics elements is preferably from 100 μm to 600 μm, more preferably from 150 μm to 500 μm, further preferably from 150 μm to 450 μm.

In case the adhesive agent comprises the urethane polymers having isocyanate group at the end of the molecule, completion of hardening of the pasted sheet using the moisture-hardening adhesive agent according to an embodiment of the invention can be determined as the time at which not less than 90% of isocyanate groups contained in the moisture-hardening adhesive agent are reacted. The completion of the reaction can be judged by occurring or not of the bulge caused by formation of carbon dioxide when the sheet is cut into the card form and subjected to heat treatment at not less than 90°. The status of the reaction on the half way can be investigated by measuring the infrared absorption spectrum for estimation the amount of the isocyanate group.

When the viscosity of the adhesive agent at 120° C. is lower than 5,000 mPs, many bubbles are formed on the occasion of the pasting and, and when the viscosity is higher than 20,000 mPs, the coating ability of the adhesive agent is lowered and the surface flatness is degraded. The viscosity of preferably from 5,000 mPs to 20,000 mPs since problems such as lowering of the surface strength of the card after the hardening of the adhesive agent and the occurrence of burrs and whiskers rise when outside of such the range.

(Electronics Elements)

The electronics elements are the parts for information recording; in concrete, the IC chip for memorizing the information of the user of the electronics card and a coil-shaped antenna. The IC chip is constituted by a memory only or a micro-computer additionally to the memory, a condenser may be contained in the electronics elements according to circumstance.

In an embodiment of the invention, there is no limitation on the electronic element as long as that is the electronics component necessary for the information recording element. The IC module has the coil antenna. When the antenna is a patterned antenna, one made by an electro-conductive paste print method, one made by a copper foil etching method and one made by a coil welding method, for example, may be used for preparing the antenna.

As the print substrate, a thermoplastic film such as a polyester film, a polyimide film is advantageous when higher heat resistivity is required. For contacting the IC chip and the antenna pattern, a method using an electro-conductive adhesive agent such as a silver paste, a copper paste and carbon paste, for example, EN-4000 series manufactured by Hitachi Kasei Kogyo Co., Ltd., and XAP series, manufactured by Toshiba Chemical Co., Ltd., or a method using an anisotropic electro-conductive film such as Anisolm, manufactured by Hitachi Kasei Kogyo Co., Ltd., and a method using solder are known. Any such methods may be used.

In case the adhesive agent is filled after the electronics element including the IC chip is placed on the predetermined position of the sheet material, a jointed point of the electronics element may be broken due to the flowage of the adhesive agent or the surface smoothness of the sheet may be lost due to the flowage and cooling of the adhesive agent, and those may result in a loss of manufacturing stability. Thus, it is preferable that the adhesive agent is provided on the sheet material in advance, and the electronics element is formed into a state of a porous resin film, a porous foaming resin film, a flexible resin sheet, porous resin sheet, or a non-woven sheet to enclose the electronics element in the adhesive agent.

For example, the preparing method described in U.S. Pat. No. 6,445,656 can be used. Further, since the IC chip tends to have a relatively small strength against point pressure, it is preferable that the IC chip has a buck-up plate. The thickness of the electronics element is preferably 10 to 300 μm, more preferably 30 to 300 μm, still more preferably 30 to 250 μm.

(Method to Fix an Electronics Element Between the First Sheet Material and the Second Sheet Material)

As methods to fix an electronics element between the first sheet material and the second sheet material, a heat pasting up method, an adhesive agent pasting up method and injection molding method are acknowledged. The first sheet material and the second sheet material can be subjected to a format printing or an information recording before or after pasting up. The format printing or the information recording can be provided by utilizing an offset printing method, a gravure printing method, a silk printing method, a screen printing method, an intaglio printing method, a relief printing method, an ink-jet recording method, a sublimation transfer method, an electrophotographic method, or a heat melting method.

The IC-installed card substrate is produced by pasting and coating as described in JP O.P.I. Publication Nos. 2000-036026, 2000-219855, 2000-211278, 10-316959 and 11-5964. Any of the pasting and coating methods may be applied in an embodiment of the invention without any limitation.

As the method for providing the adhesive agent at the predetermined position, the adhesive agent can be coated at the designated position by a screen printing method or a gravure printing method. When the hot-melt adhesive agent is used, the adhesive agent can be coated at the designated position by coating the adhesive agent into the bead state from the nozzle of a gun type hot-melt applicator. It is also possible that the adhesive agent formed into a film-shape is cut and positioned at the designated position and then heated and pressed for pasting.

(Sheet Material for Preparing IC Card Substrate)

Examples of the sheet material include a sheet of a synthesized resin, for example, a polyester resin such as poly(ethylene terephthalate), poly(butylene terephthalate) and poly(ethylene terephthalate/isophthalate) copolymer; a polyolefin resin such as polyethylene, polypropylene and polymethylpentene; a poly-fluorinated resin such as poly (vinyl fluoride), poly(vyinylidene fluoride), poly(ethylene tetra-fluoride) and ethylene/ethylene tetra-fluoride copolymer; a polyamide such as Nylon 6 and Nylon 6.6; a vinyl polymer such as poly(vinyl chloride), vinyl chloride/vinyl acetate copolymer, ethylene/vinyl acetate copolymer, ethylene/vinyl alcohol copolymer, poly(vinyl alcohol) and Vinylon; a biodegradable resin such as biodegradable aliphatic polyester, biodegradable polycarbonate, biodegradable polylactate, biodegradable poly(vinyl alcohol), biodegradable cellulose acetate and biodegradable polycaprolactone; a cellulose resin such as cellulose triacetate and cellophane; an acryl resin such as poly(methyl methacrylate), poly(ethyl methacrylate), poly(ethyl acrylate) and poly(butyl acrylate); polystyrene, polycarbonate, polyacrylate and polyimide; paper such as high quality paper, thin paper, glassine paper and sulfate paper; and metal foil. The foregoing materials may be used as a single layer or a laminated layer constituted by two or more layers thereof.

In an embodiment of the invention, the thickness of each of the sheet material is from 30 μm to 300 μm, preferably from 50 μm to 280 μm. The heat shrinking ratio of the sheet material is preferably not more than 1.2% in the lengthwise direction (MD) and not more than 0.5% in the widthwise direction (TD) measured at 150° C./30 min for inhibiting the shrinkage and bending of the sheet material caused by heat to hold the conveyance suitability of the card substrate. The surface of the sheet material may be subjected to an adhesion improving treatment for raising the sticking ability, or an antistatic treatment for protecting the chip.

In concrete, U2 series, U4 series and UL series, manufactured by Teijin-du Pont Film Co., Ltd., Crysper G series, manufactured by Toyo Boseki Co., Ltd., and E00 series, E20 series, E22 series, X20 series, E40 series, E60 series and QE series are suitably used. A cushion layer may be provided on the second sheet material according to an embodiment of the invention in addition to the image receiving layer for forming the portrait image of the card user. On the surface of the personal certificate card substrate, an image element such as at least one of a certification discriminate image such as the portrait image, a property information image and a format may be provided. The card may be a white card having no printed image.

(Pasting)

On the occasion of the pasting, heating and pressing are preferably applied for raising the flatness of the substrate surface and the sticking of the first sheet material and the second sheet material; the method is preferably performed by a pressing from the upper and lower sides or a lamination. The heating is preferably performed at a temperature of from 10° C. to 180° C., more preferably from 30° C. to 150° C. The pressure is preferably from 1.0 to 300 kgf/cm$^2$, more preferably from 1.0 to 200 kgf/cm$^2$. When the pressure is higher than the foregoing value, the IC chip may be destroyed. The period of application of the heating and pressing is preferably from 0.001 seconds to 90 seconds, more preferably from 0.001 seconds to 60 seconds. When the period is longer than that, the production efficiency may be lowered.

The IC card is produced by the following procedure: the first sheet material and the second sheet material are pasted together with the adhesive agent to form the pasted sheet, and the pasted sheet including the IC module having the IC chip and the antenna in the adhesive agent layer thereof is stored under the designated condition, then the sheet is supplied to the punching die and the IC card is punched off from the sheet. In such case, certificate discrimination image and bibliographic items may be recorded on the card before the punching.

(Thermally Hardenable Type Resin Layer)

In an embodiment of the invention, a resin such as an epoxy resin, a polyester resin and an acryl resin is usable as the thermally hardenable resin composition formed on the card substrate, and a hardening agent, a hardening catalyst and a spreading agent, and another additive may be added to the composition. The polyester resin is preferably constituted by an aromatic dicarboxylic acid such as terephthalic acid and isophthalic acid as the principal dicarboxylic acid component and an aliphatic diol such as ethylene glycol and neopentyl glycol as the principal diol component. One containing a little amount of an aliphatic dicarboxylic acid such as adipic acid and azelaic acid, a carboxylic acid such as trimellitic acid and pyromellitic acid, and a tri- or more valent alcohol such as trimethylol ethane, trimethylol propane and pentaerythritol, is preferred since such the composition is improved in the fluidity in the fused state and cross-linking reactivity. The average polymerization degree of the polyester resin is preferably from 5 to 50. When the average polymerization degree of the resin is less than 5, there is a case that satisfactory strength cannot be obtained when the resin is formed into a film. The resin having the average polymerization degree more than 50 may be difficultly crashed. As the hardening agent, an isocyanate compound and a melamine resin such as ε-caproluctum block isocyanate and methylated melamine is usable for the resin having a —OH group at the terminal thereof and an epoxy resin and triglycidyl isocyanurate are usable for the resin having a —COOH group at the terminal thereof.

(Preparation Method of Heat- or Light-Hardening Type Resin Layer)

When a heat- or light-hardening type resin layer is provided on the card substrate, the layer is preferably formed by a coating method or a transfer foil method. When the coating method is applied for protecting the card substrate, known method such as rotary coating method, a wire bar coating method, a dipping coating method, a felt coating method, an air-knife coating method, a spray coating method, an air-spray coating method, a static air-spray method, a roller coating method, a blade coating method and a curtain coating method. The coating amount is preferably from 0.05 to 50.0 g/m$^2$ in the solid component amount even though the coated amount is varied according to the use. The sensitivity is raised accompanied with reducing the coated amount but the property and the chemical resistivity of the layer is lowered. Ones emitting active electromagnetic radiation are all usable as the means for hardening the coated layer. Example of the light source include a laser, a light-emission diode, a xenon flash lamp, a halogen lamp, a carbon arc lamp, a metal halide lamp, a tungsten lamp, a mercury lamp and a non-electrode light source. Among them, the xenon lamp, halogen lamp, carbon arc lamp, metal halide lamp, tungsten lamp and mercury lamp are preferred. Energy applied on this occasion can be optionally selected by controlling the kind of the hardening agent and the distance, time and the intensity of the exposure light.

(Heat Treatment)

As a heating means, an oven, a heating roller, a hot stump, a thermal head, a laser, an infrared flash lamp or a heating pen may be optionally selected. The protective layer constituted by the heat- or light-hardening type resin can be formed by the following procedure. A transparent protective layer ribbon or a transparent protective foil formed by coating on, for example, a polyethylene terephthalate film is previously prepared and then the protective layer is transferred from the ribbon or the foil by a heating means such as a thermal head or a heat transfer roller.

(Method of Transfering the Transfer Foil onto IC Card)

The transfer from the transfer foil is performed by a means for applying pressure while heating such as the thermal head, heat roller and the hot stump.

(Image Receiving Layer for Accepting Sublimation or Heat-Diffusible Dye Image by Thermal Transfer Recording Method)

The image receiving layer carried on the second sheet material can be formed by a binder and various additives. The image receiving layer in an embodiment of the invention should have good dying ability for the sublimation dye or a good adhesive ability with a thermal fusible ink additionally to the high dying ability for the sublimation dye since an image containing gradation information formed by the thermal sublimation transfer method and an image containing character information formed by the sublimation transfer method or the fusion transfer method are accepted by the image receiving layer. It is necessary to suitably control the kind and the combination of the binder and the additives for giving such the specific properties to the image receiving layer.

The ingredients of the image receiving layer are described in detail below.

As the binder of the image receiving layer, usually known binders to be used for the sublimation thermal transfer recording image receiving layer may be used. As the principal binder, various binders such as a vinyl chloride resin, a polyester resin, a polycarbonate resin, an acryl resin, a polystyrene resin, a poly(vinyl acetal) resin and a poly(vinyl butyral) resin are usable.

When a practical property, for example a designated heat resistivity for an issued ID card, is required to an image formed according to an embodiment of the invention, the kind and the combination of the binder should be considered so as to satisfy the requirement. In the example of the heat resistivity of the image, when a heat resistivity for 60° C. or more, a binder having a Tg of not less than 60° C. is preferably used considering the spreading of the sublimation dye.

In some cases, it is preferred to add a metal ion-containing compound on the occasion of preparing the image receiving layer. Particularly, the addition of the metal ion-containing compound is preferred in the case that the thermally transferring compound forms a chelate compound by reaction with the metal ion-containing compound. Examples of the metal ion constituting the metal ion-containing compound include di-valent and poly-valent metals included in I to VIII groups of the periodic table. Among them, Al, Co, Cr, Cu, Fe, Mg, Mn, Mo, Ni, Sn, Ti and Zn are preferable, and Ni, Cu, Co, Cr, and Zn are particularly preferable. An inorganic and organic salts or a complex salt of each of such metals are preferable.

In concrete, a complex salt represented by the following formula containing $Ni^{2+}$, $Cu^{2+}$, $Co^{2+}$, $Cr^{2+}$, or $Zn^{2+}$.

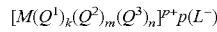

$$[M(Q^1)_k(Q^2)_m(Q^3)_n]^{p+}p(L^-)$$

In the formula, M is a metal ion; $Q^1$, $Q^2$ and $Q^3$ are each a coordination compound capable of forming coordinate bond with the metal ion represented by M. The coordination compound can be selected from the coordination compound described in, for example, "Chelate Chemistry (5)" published by Konando. Coordination compounds having at least one amino group capable of forming coordinate bond with the metal are preferable. Concrete examples of such the coordination compound include ethylenediamine and a derivative thereof, glycinamide and a derivative thereof and picolinamide and a derivative thereof. L is a counter ion capable of forming the complex, for example, an inorganic compound anion such as Cl, $SO_4$ and $ClO_4$, and an organic compound anion such as an alkylbenzenesulfonic acid derivative and an alkylsulfonic acid derivative. Tetraphenylboron anion and a derivative thereof and alkylbenzenesulfonate anion are particularly preferred. k is an integer of 1, 2 or 3; m is an integer of 1, 2 or 0; and n is an integer of 1 or 0. These values are determined by that the complex is a 4-ligand complex or 6-ligand complex, or the number of the ligand of $Q^1$, $Q^2$ and $Q^3$. p is 1, 2 or 3. Examples of the metal ion-containing compound include those described in U.S. Pat. No. 4,987,049.

When the metal ion-containing is added, the adding amount is preferably from 0.5 to 20 $g/m^2$, more preferably from 1 to 15 $g/m^2$ of the image receiving layer. A mold releasing agent is preferably added to the image receiving layer. A mold releasing agent miscible with the binder is preferably used. In concrete, modified silicone oil and modified silicone polymer are the typical mold releasing agent. For example, amino-modified silicone oil, epoxy-modified silicone oil, polyester-modified silicone oil, acryl-modified silicone resin and urethane-modified resin are usable. Among them, polyester-modified resin is particularly superior on the point of that the resin prevents the welding of the ink sheet even though it does not disturb the secondary processing ability of the image receiving layer. The secondary processing ability means writing ability by permanent marker and suitability to lamination for protecting the image. Other than the above, a fine particle such as silica is also effective as the mold releasing agent. When the secondary processing ability is not required, a hardenable silicone compound is also effectively used. UV-hardenable type silicone and reaction hardenable type silicone are available on the market and large effect can be expected.

The image receiving layer can be prepared by a coating method in which a coating liquid for image receiving layer is prepared and coated onto the sheet material and dried. In the coating liquid, constituting ingredients are dispersed or dissolved. The thickness of the image receiving layer formed on the sheet material surface is usually from 1 to 50 μm, preferably about from 2 to 10 μm. In an embodiment of the invention, a cushion layer or a barrier layer may be provided between the sheet material and the image receiving layer. An image corresponding to the image information can be transferred and recorded with high reproducibility and low noise by the presence of the cushion layer. As the material of the cushion layer, urethane resin, acryl resin, propylene resin, butadiene rubber and light-hardenable resin described in JP O.P.I. Publication No. 2001-16934 are usable. The thickness of the cushion layer is usually from 1 to 50 μm, preferably about from 3 to 30 μm.

To form the information carrier, the format can be printed by usual ink described in "Technology of Lithographic Printing", "New Outline of Printing Technology", "Offset Printing Technology", "Illustrated Make-up and Printing Technology" each published by Printing Technological Society of Japan. The format is formed by a carbon ink such as a light-hardenable type ink, an oil-soluble ink and a solvent-soluble ink. Watermark printing, hologram and fine pattern may be applied to prevent forgery of the card. As the forgery or alteration preventing means, a printed pattern, hologram, pattern as a mat, fine pattern, texture pattern or rugged pattern can be optionally selected. A visible light absorbing colorant layer, a UV absorbent layer, an infrared absorbent layer, a fluorescent whitening agent layer, a vapor deposited metal layer, a vapor deposited glass layer, a beads layer, an optical variation element layer, a pearl ink layer, a minute scales pigment layer or an antistatic layer may be provided on the surface sheet by printing.

As the material for constituting the cushion layer, the light-curable resin described in JP O.P.I. Publication No. 2001-16934 and polyolefin are preferable. A resin having high softness and low heat conductivity such as a polyethylene, a polypropylene, an ethylene/vinyl acetate copolymer, a styrene/ethyl acrylate copolymer, a styrene/butadiene/styrene block copolymer, a styrene/ethylene/butadiene/styrene block copolymer, a styrene/hydrogenated isoprene/styrene block polymer and polybutadiene are suitable.

(Cushion Layer)

As the material for constituting the cushion layer, a polyolefin is preferable. A resin having high softness and low heat conductivity such as a polyethylene, a polypropylene, an ethylene/vinyl acetate copolymer, a styrene/ethyl acrylate copolymer, a styrene/butadiene/styrene block copolymer, a styrene/ethylene/butadiene/styrene block copolymer, a styrene/hydrogenated isoprene/styrene block polymer and polybutadiene are suitable. In concrete, the cushion layer described in JP O.P.I. Publication No. 2001-16934 is usable. There is no limitation on the cushion layer in an embodiment of the invention as long as the cushion layer is provided between the image receiving layer and the electronics parts. It is particularly preferred that the cushion layer is formed by coating or pasting on the second sheet material of the other support which is substantially the same quality as substrate or on the first and second sheet materials.

(Writable Layer)

The writable layer is a layer for making writable the back side of the ID card. The writable layer can be formed by adding an inorganic fine powder such as calcium carbonate, talk, diatomite, titanium oxide and barium sulfate into a heat-hardenable resin, for example, polyolefin such as polyethylene and various copolymers. "Writable layer" described in JP O.P.I. Publication No. 1-205155 can be applied. The writable layer is formed on the first sheet material on which plural layers are not laminated.

(Support for Transfer Foil)

Examples of the support for the transfer foil include a polyester resin such as poly(ethylene terephthalate), poly(butylenes terephthalate) and ethylene terephthalate/isophthalate copolymer; a polyolefin resin such as polyethylene, polypropylene and polymethylpentene; a poly(fluorinated ethylene) resin such as poly(vinyl fluoride), poly(vinylidene fluoride), poly(ethylene tetrafluoride) and ethylene/ethylene tetrafluoride copolymer; a polyamide such as Nylon 6 and Nylon 6.6; a vinyl polymer such as poly(vinyl chloride), vinyl chloride/vinyl acetate copolymer, ethylene/vinyl acetate copolymer, ethylene/vinyl alcohol copolymer, poly(vinyl alcohol) and Vinylon; a cellulose resin such as cellulose triacetate and Cellophane; an acryl resin such as ply(methyl acrylate), poly(ethyl methacrylate), poly(ethyl acrylate) and poly(butyl acrylate); a sheet of synthesized resin such polystyrene, polycarbonate, polyallylate and polyimide; paper such as high quality paper, thin leaf paper; glassine paper and sulfate paper; and metal foil; and a piled member thereof composed of two or more layers.

The thickness of the support for the transfer foil is preferably from 10 to 200 μm, more preferably from 15 to 80 μm. When the thickness is less than 10 μm, the support may be destroyed on the occasion of the transfer. Poly (ethylene terephthalate) is preferred for the mold releasing layer specified in an embodiment of the invention. The support in an embodiment of the invention may have surface irregularity according to necessity. The surface irregularity can be provided by kneading with a matting agent, a sand blast treatment, a hairline treatment, a mat coating or chemical etching. In the mat coating, either an organic substance or an inorganic substance may also be used. The inorganic substance such as the silica described in Swiss Patent No. 330,158, the glass powder described in French Patent No. 1,296,995, the carbonate of an alkali-earth metal, cadmium or zinc described in British Patent No. 2,322,037 is usable as the matting agent. The organic substance such as the starch described in U.S. Pat. No. 2,322,037, the starch derivatives described in Belgian Patent No. 625,451 and British Patent No. 981,198, the poly(vinyl alcohol) described in JP Examined Publication No. 44-3643, the polystyrene and polymethacrylate described in Swiss Patent No. 330,158, the polyacrylonitrile described in U.S. Pat. No. 3,079,257 and the polycarbonate described in U.S. Pat. No. 3,022,169 are usable as the organic matting agent. The matting agent may be adhered either by a method in which the matting agent is dispersed in a coating liquid and coated or a method in which the matting agent is sprayed on a layer of a coating liquid before dried. The both of the foregoing methods may be applied in combination when plural kinds of the matting agent are used. The irregularity providing treatment may be applied to one or both of the transferring surface and the back surface.

(Releasing Layer of Transfer Foil)

Examples of the material usable as the releasing layer include an acryl resin having a high grass transition point, a resin such as poly(vinyl acetal) resin and poly(vinyl butyral) resin, a wax, a silicone oil; a fluorine compound, a poly(vinyl pyrrolidone) resin, a poly(vinyl alcohol) resin, a Si-modified poly(vinyl alcohol), a methyl cellulose resin, a hydroxy cellulose resin, a silicone resin, a paraffin wax, an acryl-modified silicone, a polyethylene wax and an ethylene vinyl acetate resin. Other than the foregoing, polydimethylsiloxane and a modified compound thereof, oil and resin such as polyester-modified silicone, acryl-modified silicone, alkyd-modified silicone, amino-modified silicone, epoxy-modified silicone and polyether-modified silicone, and a hardened substance thereof are also usable. As another fluorine compound, a fluorized olefin and a perfluorophosphic ester can be exemplified. Examples of preferable olefin compound include a dispersion of polyethylene or polypropylene, and a long chain alkyl compound such as poly(ethyleneimine octadecyl). Among these compounds, ones with low solubility can be used in a state of dispersion. A thermoplastic estramer may be added when two sheet of the transfer foil are transferred.

Concrete examples of the thermoplastic estramer include a styrene type estramer such as styrene block copolymer (SBC), an olefin type estramer (TP), a urethane type estramer (TPU), a polyester type estramer (TPEE), a polyamide type estramer (TPAE), a 1,2-polybutadiene type estramer, a vinyl chloride type estramer (TVPC), a fluoride type estramer, an ionomer resin, a polyethylene chloride estramer and a silicone type estramer, which are concretely described in "12996 Chemical Products" 1996, Kagaku Kogyo Nippou Sha.

The thermoplastic estramer suitably used in an embodiment of the invention having a stretching elongation of not less than 100% constituted by a block polymer of polystyrene and polyolefin is a thermoplastic resin composed of a block of styrene and that of saturated straight- or branched-alkyl having not more than 10 carbon atoms, hereinafter referred to as thermoplastic resin S1. A styrene/butadiene/styrene (SBS), styrene/isoprene/styrene (SIS), styrene/ethylene-butylene/styrene (SEBS), styrene/ethylene-propylene/styrene (SEPS) and styrene/ethylene-ethylene/propylene (SEP) are particularly suitable, which are a block copolymer having a polystyrene phase and a hydrogenated polyolefin phase.

A heat-hardenable resin layer may be used between the mold releasing layer and the resin layer or the active light-hardenable layer. In concrete, a polyester resin, an acryl resin, an epoxy resin, a xylene resin, a guanamine resin, a diallyl phthalate resin, a phenol resin, a polyimide resin, a maleic resin, a melamine resin, a urea resin, a polyamide resin and urethane resin are usable.

As the transparent resin layer of the transfer foil, a poly(vinyl butyral) resin, a polyurethane resin, a polyamide resin, a polyester resin, an epoxy resin, a novolac resin, a vinyl monomer such as styrene, para-methylstyrene, methacrylate and acrylate, a cellulose resin, a thermoplastic resin and a natural resin and another optional high molecular weight polymer may be used in combination. Known organic high molecular polymers described in "New Practical Technology of Light Sensitive Resin" edited by K. Akamatsu, 1987, published by CMC, and "10188 Chemical Products" p.p. 657–767, 1988, Kagaku Kogyo Nippou Sha, may further used in combination.

In an embodiment of the invention, it is preferable that the light/heat-hardenable layer is provided on the IC card for the purpose to protect by the use of the transfer foil. There is no limitation on the light/heat hardenable layer as long as the layer is constituted by the foregoing composition. The thickness of the transparent resin layer is preferably from 0.3 to 50 μm, more preferably from 0.3 to 30 μm, further preferably from 0.3 to 20 μm.

The interlayer of the transfer foil is preferably constituted by one or more layers; the interlayer may be as a primer layer or a barrier layer, and the layer may also be a layer for raising the adhesiveness between the layers. The followings are usable for the interlayer, a vinyl chloride resin, a polyester resin, an acryl resin, a poly(vinyl acetal) resin, a poly(vinyl butyral) resin, poly(vinyl alcohol), polycarbonate resin, a cellulose resin, a styrene resin, a urethane resin, an amide resin, a urea resin, an epoxy resin, a phenoxy resin, a polycaproluctone resin, a polyacrylonitryl resin, SEBS resin and a SEPS resin and the modified products thereof.

Among the foregoing resins, the vinyl chloride resin, polyester resin, acryl resin, poly(vinyl butyral) resin, styrene resin, epoxy resin, urethane resin, urethane acrylate resin, SBES resin and SEPS resin are preferable for the purpose of an embodiment of the invention. These resins may be used solely or in combination of two or more kinds thereof. In concrete, a thermoplastic resin constituted by a block polymer of polystyrene and polyolefin, and poly(vinyl butyral) are preferable.

As the material of the interlayer according to an embodiment of the invention, poly(vinyl butyral) resin having a polymerization degree of not lees than 1,000 is available on the market in the commercial name of Elex BH-3, BX-1, BX-2, BX-5, BX-55 and BH-S, manufactured by Sekisui Kagaku Kogyo, Co., Ltd., Denka Butyral #4000-2, #5000-A and #6000-EP, manufacture by Denki Kagaku Kogyo CO., Ltd. There is no limitation on the polymerization degree before the hardening, and a resin having a low polymerization degree may also be usable. An isocyanate hardening agent or an epoxy hardening agent may be used; the hardening condition of a temperature of from 50 to 90° C. for a period of from 1 to 12 hours is preferable. The thickness of the interlayer is preferably from 0.1 to 1.0 μm.

As the adhesive layer of the transfer foil, a heat-adhesive resin such as an ethylene-vinyl acetate resin, an ethylene-ethyl acrylate resin, an ethylene-acrylic acid resin, an ionomer resin, a polybutadien resin, an acryl resin, a polystyrene resin, a polyester resin, an olefin resin, a urethane resin, a adhesive ability providing agent such as a phenol resin, a rosin resin, a terpene resin and a petroleum resin can be used. A copolymer or a mixture of them may also be used. In concrete, urethane-modified ethylene acrylate copolymer Hitec S-6254, S-6254B and S-3129, manufactured by Toho Kagaku Kogyo Co., Ltd., and urethane-modified polyacrylate copolymer Jurimer AT-210, AT-510, AT-613, manufactured by Nihon Jun-yaku Co., Ltd., and Plus Size L-201, SR-102, SR-103 and J-4 are available on the market. The weight ratio of the urethane-modified ethylene acrylate copolymer to the polyacrylate copolymer is preferably from 9:1 to 2:8; and the thickness of the adhesive layer is preferably from 0.1 to 1.0 μm.

An optical variable device (OVD) transfer layer may be provided for preventing the forgery and alteration when it is necessary. The optical variation device is 1) a two dimensional CG image of a diffraction grating such as a cinegram by which a freely moving, rotating, extending or reducing line drawing image can be seen; 2) one such as Pixelgram by which an image is varied positive to negative; 3) one such as an optical security device (OSD) by which the color is changed gold to green; 4) one such as a long lasting economical anti-copy device (LEAD) by which an image changing can be seen; 5) a strip type OVD or 6) metal foil. The security may be held by a material of paper, a specific printing technology and a specific ink such as those described in "The Journal of Printing Society of Japan", p.p. 482–496, No. 6, Vol. 35, 1998. In an embodiment of the invention, hologram is particularly preferred.

(IC Card Producing Method)

A preparing method of the IC card using the hot-melt type moisture hardenable adhesive agent is described below. On each of the first and second sheet materials, the adhesive agent is coated by an applicator in the designated thickness, respectively. For coating a usual method such as a roller method, a T-die method and a dies method may be used. When the adhesive agent is coated in a stripe shape, a method in which a t-die slit having mouths arranged at a certain interval may be applied, but the method is not limited thereto.

For making surface irregularity on the surface of the coated adhesive agent, a method of pressing by the use of an embossing roller may be applied. The IC parts are furnished between the sheet materials for the surface side and that for the back side. The coated adhesive agent may be heated before the furnishing of the IC parts. The assembly of the surface and back side sheet materials and the IC parts furnished between the sheets is pressed for a designated time by a pressing machine heated at the pasting temperature of the adhesive agent. The assembly may be pressed by rollers while conveying in a thermostat held at the designated temperature instead of the pressing by the pressing machine. Pressing in vacuum may be applied for preventing the intrusion of a bubble on the occasion of the pressing. The pasted sheet is punched or cut into the shape of card after the pasting. The pasted sheet is cut into the shape of card after hardening reaction for the designated period. For accelerating the hardening, it is effective means to made holes around the card size of the pasted sheet to supply the moisture necessary for reaction.

In an embodiment of the invention, when the card substrate is formed in the shape of the card form, the method is selected in which the first sheet material and the second sheet material are pasted through the adhesive agent, and the pasted and laminated sheet material is formed into the card shape size. As the method to form the cars size, punching and the cutting are principally applied.

EXAMPLES

The embodiment of the invention is described in detail referring examples but the embodiment of the invention is not limited to the examples. In the followings, "part" is "part by weight".

<Preparation of adhesive agent>

| | |
|---|---|
| Macroplast QR3460 (Henkel Co., Ltd.) | 80 parts |
| Porous high silica aluminosilicate, AMT-SILICA #200B (Mizusawa Kagaku Kogyo Co., Ltd.) | 25 parts |

The above components were stirred by a homogenizer for 60 minutes at 180° C. to prepare Adhesive Agent 1 having a viscosity of 14,500 mps/130° C.

<Preparation of the First Sheet Material (Back Side Sheet Material)>

U2L98W low thermal shrinking grade having a thickness of 188 μm, manufactured by Teijin-DuPont Co., Ltd., was used as the first sheet material (back side sheet material).

(Preparation of Writable Layer)

The following first, second and third writable layer coating liquids were coated on the first sheet material having the thickness of 188 μm in this order and dried. The coating was carried out so that the thicknesses of the layers were each 5 μm, 15 μm and 0.2 μm, respectively. Thus the writable layer was formed.

The first writable layer coating liquid

| | |
|---|---|
| Polyester resin, Vilon 200 (Toyo Boseki Co., Ltd.) | 8 parts |
| Isocyanate, Coronate HX (Nihon Polyurethane Kogyo Co., Ltd.) | 1 part |
| Carbon black | A slight amount |
| Titanium dioxide particle, CR 80 (Ishihara Sangyou Co., Ltd,) | 1 part |
| Methyl ethyl ketone | 80 parts |
| Butyl acetate | 10 parts |

The second writable layer coating liquid

| | |
|---|---|
| Polyester resin, Vilonal MD1200 (Toyo Boseki Co., Ltd.) | 4 parts |
| Silica | 5 part |
| Titanium dioxide particle, CR 80 (Ishihara Sangyou Co., Ltd,) | 1 part |
| Water | 90 parts |

The third writable layer coating liquid

| | |
|---|---|
| Polyamide resin, Sanmide 55 (Sanwa Kagaku Kogyo Co., Ltd.) | 5 parts |
| Methanol | 95 parts |

The center-line average roughness of thus obtained writable layer was 1.34 μm.

(Formation of Format Printing Layer on the Writable Layer)

A format including a ruled line, the name of issuing person and his telephone number was printed by an off-set printing method. UV-hardenable black ink was used. The irradiation of UV rays for the printing was corresponding to 200 mj. The light source was a high pressure mercury lamp.

(Formation of IC Covering Layer)

Figure 4:
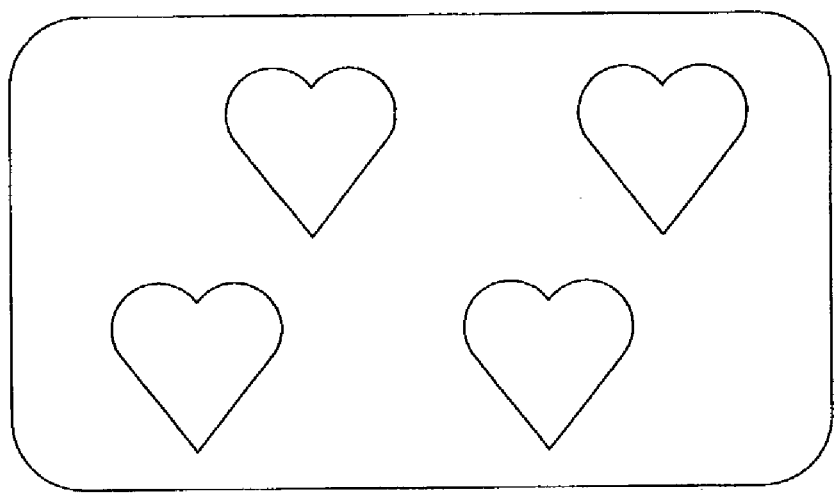
FIG. 4 shows a pattern printed on the concealing layer.
Figure 5:
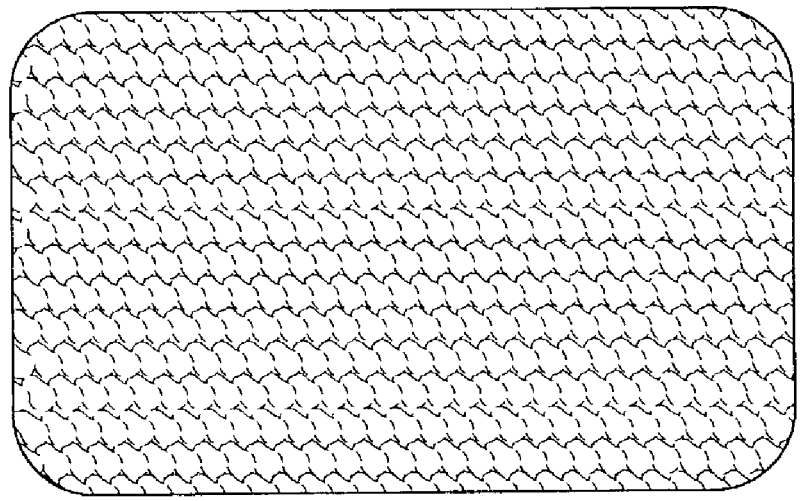
FIG. 5 shows a pattern printed on the concealing layer.

Water mark printing was provided on the outermost surface of the support opposite to the writable layer surface by a resin relief printing method. The printing pattern shown in FIG. 4 or FIG. 5 was printed. A UV-hardenable black ink was used for the printing. The irradiation of UV rays for the printing was corresponding to 200 mj. The layer thickness was 1.0 μm.

<Preparation of the Second Sheet Material (the Surface Side Sheet)>

U2L98W low thermal shrinking grade having a thickness of 188 μm, manufactured by Teijin-DuPont Co., Ltd., was used as the second sheet material (surface side sheet material).

(Preparation of the Surface Sheet Material)

The second sheet material (Surface Sheet Material 1) was prepared by coating the following cushion layer and image receiving layer in this order on the foregoing support of the second sheet material having a thickness of 188 μm.

Light-curable layer: Thickness of 10 μm

| | |
|---|---|
| Urethane acrylate oligomer, NK-oligo US512 (Shin Nakamura Kagaku Co., Ltd.) | 55 parts |
| Polyester acrylate, Alonix M6200 (Toa Gousei Co., Ltd.) | 15 parts |
| Urethane acrylate oligomer, NK-oligo UA4000 (Shin Nakamura Kagaku Co., Ltd.) | 25 parts |
| Hydroxycyclohexyl phenyl ketone, Irgacure 184 (Ciba Speciality Chemicals Co., Ltd.) | 5 parts |
| Methyl ethyl ketone | 100 parts |

The coated light-curable compound was dried at 90° C. for 30 second and hardened by light of 300 ml/cm$^2$ using a mercury lamp.

<Image Receiving Layer>

The first, second and third image receiving layer coating liquids were coated in this order on the foregoing cushion layer so that the thicknesses of the each layers were 0.2 μm, 2.5 μm and 0.5 μm, respectively.

The first image receiving layer coating liquid

| | |
|---|---|
| Poly(vinyl butyral) resin, Elex BL-1 (Sekisui Kagaku Kogyo Co., Ltd.) | 9 parts |
| Isocyanate, Coronate HX (Nihon Polyurethane Kogyo Co., Ltd.) | 1 part |
| Methyl ethyl ketone | 80 parts |
| Butyl acetate | 10 parts |

The second image receiving layer coating liquid

| | |
|---|---|
| Poly(vinyl butyral) resin, Elex BX-1 (Sekisui Kagaku Kogyo Co., Ltd.) | 6 parts |
| Metal ion-containing compound (Complex MS) | 4 parts |
| Methyl ethyl ketone | 80 parts |
| Butyl acetate | 10 parts |

The third image receiving layer coating liquid

| | |
|---|---|
| Polyethylene wax, Hitec E1000 (Toho Kagaku Kogyo CO., Ltd.) | 2 parts |

| -continued | |
|---|---|
| Urethane-modified ethylene acrylic acid copolymer, Hitec S6254 (Toho Kagaku Kogyo CO., Ltd.) | 8 parts |
| Methyl cellulose, SM15 (Shin-etsu Kagaku Kogyo CO., Ltd.) | 0.1 parts |
| Water | 90 parts |

(Formation of Information Carrying Member Constituted by Format Printed Layer)

A format including a certificate of an employee and his name was printed on the image receiving layer by an off-set printing method. A UV-hardenable black ink was used. The irradiation of UV rays for the printing was corresponding to 200 mj. The light source was a high pressure mercury lamp.

(Formation of Transparent Resin Layer)

Printing ink constituted by the following ingredients prepared by mixed by a roll mille. A layer of the ink was printed on the image receiving layer by off-set printing. The irradiation of UV rays on the occasion of the printing was corresponding to 200 mj. The light source was a high pressure mercury lamp.

| Transparent resin layer composition 1 | |
|---|---|
| Urethane acrylate oligomer | 50 parts |
| Aliphatic polyester acrylate oligomer | 35 parts |
| Dilocure 1173 (Ciba Speciality Chemicals Co., Ltd.) | 5 parts |
| Trimethylolpropane acrylate | 10 parts |

(Formation of IC Covering Layer)

Water mark printing was provided on the outermost surface of the support opposite to the image receiving layer surface by a resin relief printing method. The printed pattern was that shown in FIG. 4 or FIG. 5. The printed pattern was shown in Table 1. A UV-hardenable black ink was used for the printing. The irradiation of UV rays for the printing was corresponding to 200 mj. The layer thickness was 1.0 µm.

<Preparation of Card Substrates for IC Card>

The above-prepared first and second sheet materials were used. The first sheet material (the back sheet material) was set on the first sheet material supplying section and the second sheet material was set on the second sheet supplying section of the apparatus shown in FIG. 6 for producing the IC installed card substrate and the IC card substrate having the image receiving layer. The above-described adhesive agent 1 was put into the adhesive agent supplying section, and was coated on the first or second sheet material. Thus pasted sheets for IC card having a thickness of 760 µm were obtained. The prepared pasted sheets were stored for a designated period and finally cut by a punching machine. Thus the card substrates for IC card having a size of 55 mm×85 mm were prepared.

In an embodiment of the invention the punching die type cutting edge and the hollow cutting edge were used. The punching die type cutting edge, a pair of a punch and a die was used; the upper edge or the punch and the lower edge and the die make an angle of 90° for punching the sheet. The hollow cutting edge was an edge for punching the sheet from the upper direction; the edge having an edge angle of 28° was used. The hollow edge can punch the sheet with any breaking elongation degree since the edge had an acute angle.

Figure 6:
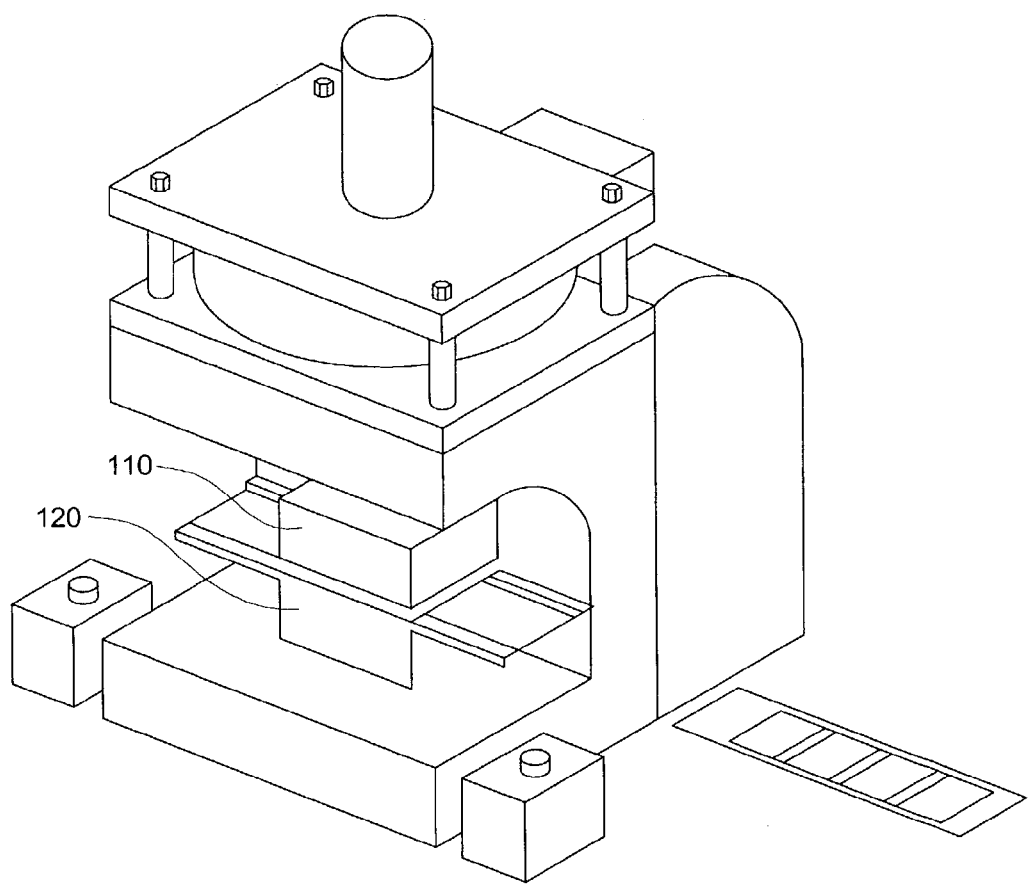
FIG. 6 shows a whole oblique view of the punching machine
Figure 7:
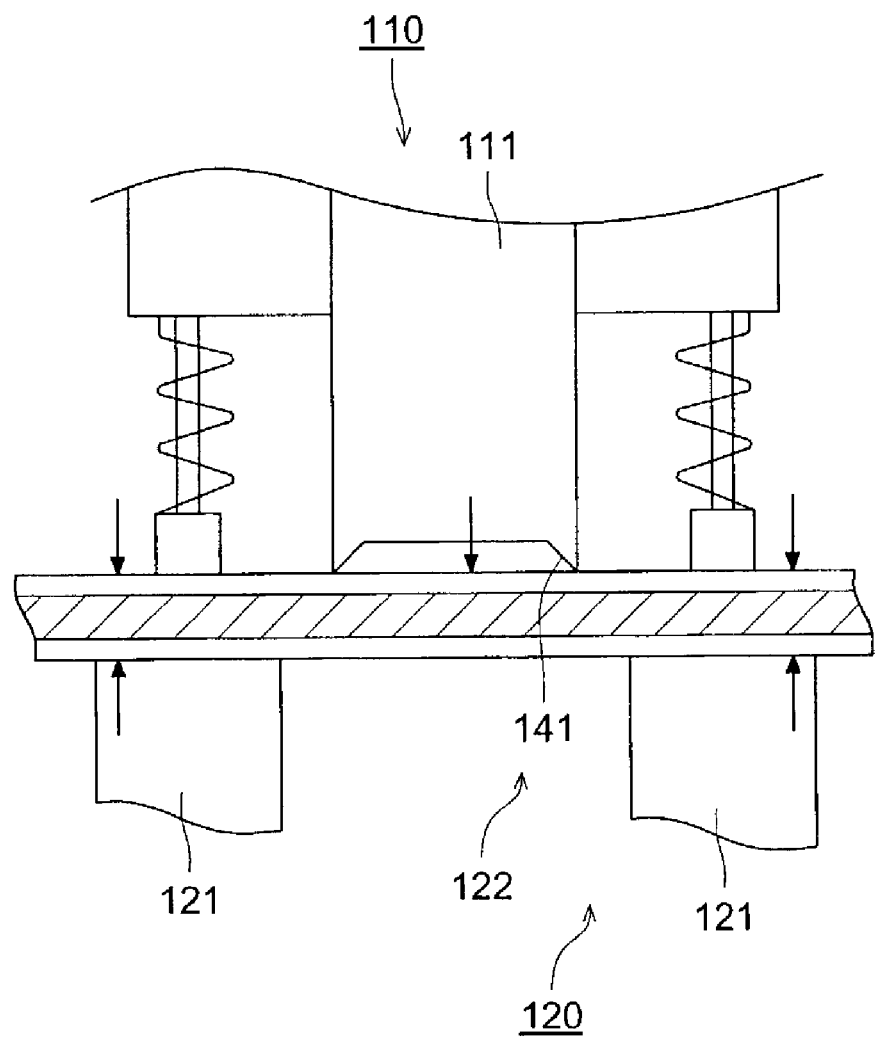
FIG. 7 shows a front view of the principal part of the punching machine.

FIG. 6 is a whole oblique view of the punching machine and FIG. 7 is a front view of the principal part of the punching machine. This punching die apparatus has a punching die having an upper edged 110 and a lower edge 120. The upper edge 110 includes a punch 111 having a way of escape 141 at the inside of the extension thereof. And the lower edge has a die 121. A card having the size the same as that of the hole of the die 122 was punched off by taking down the punch 111 into the hole 122 provided at the center portion of the die 121. Consequently the size of the punch was made so as to be slightly smaller than that of the hole of the die 122.

<Preparation Method of IC Card>

Method for describing certification and discrimination image and attribute information image <Preparation of Ink Sheet for Sublimation Type Thermal Transfer Recording>

A coating liquid for forming yellow ink layer, a coating liquid for forming magenta ink layer and a coating liquid for forming cyan ink layer were each respectively coated on a poly(ethylene phthalate) sheet so that the layer thickness was made to 1 µm. The poly(ethylene terephthalate) sheet had a thickness of 6 µm, and the back side thereof was subjected to an adhesion preventing treatment. Thus yellow, magenta and cyan colored ink sheets were obtained.

| Coating liquid for forming yellow ink layer | |
|---|---|
| Yellow dye, MS Yellow (Mitsubishi-Toatsu Senryo Co., Ltd.) | 3 parts |
| Poly(vinyl acetal), Denka Butyral KY-24 (Denki Kagaku Kogyo Co., Ltd.) | 5.5 parts |
| Poly(methyl methacrylate)-modified polystyrene, Rededa GP-200 (Toa Gosei Kagaku Kogyo Co., Ltd.) | 1 part |
| Urethane-modified silicone oil, Diaromer SP-2105 (Dainichi Seika Kogyo Co., Ltd.) | 0.5 parts |
| Methyl ethyl ketone | 70 parts |
| Toluene | 20 parts |
| Coating liquid for forming magenta ink layer | |
| Magenta dye, MS Magenta (Mitsubishi-Toatsu Senryo Co., Ltd.) | 2 parts |
| Poly(vinyl acetal), Denka Butyral KY-24 (Denki Kagaku Kogyo Co., Ltd.) | 5.5 parts |
| Poly(methyl methacrylate)-modified polystyrene, Rededa GP-200 (Toa Gosei Kagaku Kogyo Co., Ltd.) | 2 parts |
| Urethane-modified silicone oil, Diaromer SP-2105 (Dainichi Seika Kogyo Co., Ltd.) | 0.5 parts |
| Methyl ethyl ketone | 70 parts |
| Toluene | 20 parts |
| Coating liquid for forming cyan ink layer | |
| Cyan dye, Kayaset Blue (Nihon Kayaku Co., Ltd.) | 3 parts |
| Poly(vinyl acetal), Denka Butyral KY-24 (Denki Kagaku Kogyo Co., Ltd.) | 5.6 parts |
| Poly(methyl methacrylate)-modified polystyrene, Rededa GP-200 (Toa Gosei Kagaku Kogyo Co., Ltd.) | 1 part |
| Urethane-modified silicone oil, Diaromer SP-2105 (Dainichi Seika Kogyo Co., Ltd.) | 0.5 parts |
| Methyl ethyl ketone | 20 parts |

<Preparation of Ink Sheet for Fusion Type Thermal Transfer Recording>

The following coating liquid was coated and dried on a poly(ethylene terephthalate) sheet so that the thickness of the layer was 2 to prepare µm to prepare an ink sheet. The poly(ethylene terephthalate) sheet had a thickness of 6 µm and the back side thereof was subjected to an adhering prevention treatment.

| Coating liquid for forming ink layer | |
| --- | --- |
| Carnauba wax | 1 part |
| Ethylene-vinyl acetate copolymer, EV40Y (Mitsui-duPont Chemical Co., Ltd.) | 1 part |
| Carbon black | 3 parts |
| Phenol resin, Tamanol510 (Arakawa Kagaku Kogyo Co., Ltd.) | 5 parts |
| Methyl ethyl ketone | 90 parts |

<Formation of Image of Face>

The image receiving portion, the transparent resin portion or the information printing portion was piled with the ink side of the ink sheet, and a portrait image with gradation was formed on the image receiving layer by heating by a heating head under the conditions of an output power of 0.2 W/dot, a pulse width of 0.3 to 4.5 milliseconds and a dot density if 16 dots/mm. In the image, the dye and the nickel compound contained in the image receiving layer formed a complex.

<Formation of Character Information>

The transparent resin portion or the scales pigment-containing layer was piled with the ink side of the fusion type thermal transfer recording ink sheet and character information was formed on the image recording member for the IC card by heating by a thermal head under the conditions of an output power of 0.5 W/dot, a pulse width of 1.0 milliseconds and a dot density if 16 dots/mm. Thus the portrait image and the attribute information were formed.

<Synthesizing Example 1 of Resin to be Added to Surface Protective Layer of IC Card>

In a three mouth flask, 73 parts of methyl methacrylate, 15 parts of styrene, 12 parts of metacrylic acid, 500 parts of ethanol and 3 parts of α,α'-azo-bis-isobutylonitile were put and reacted for 6 hours in an oil bath at 80° C. under a nitrogen gas current. Then 3 parts of triethyleneammonium chloride and 1.0 part of glycidyl methacrylate was added reacted for 3 hours. Thus objective acryl copolymer Synthesized Binder 1 having an Mw of 17,000 and an acid value of 32 was obtained.

Protective Layer 1

<Preparation of Transparent Resin Transfer Foil 1>

The following composition was coated by a wire bar coater and dried on one side of poly(ethylene phtalate) S-25 sheet to form a protective layer.

| Mold releasing layer; Layer thickness of 0.5 μm | |
| --- | --- |
| Acryl resin, Dianal BR-87 (Mitsubishi Rayon Co., Ltd.) | 5 parts |
| Poly(vinyl acetoacetal) with a SP value of 9.4, KS-1 (Sekisui Kagaku Co., Ltd.) | 5 parts |
| Methyl ethyl ketone | 40 parts |
| Toluene | 50 parts |

After the coating, the coated layer was dried for 30 seconds at 90° C.

| Coating liquid for forming interlayer; Thickness of 0.3 μm | |
| --- | --- |
| Poly(vinyl butyral) resin, Elex BX-1 (Sekisui Kagaku Co., Ltd.) | 5 parts |
| Taftex M-1913 (Asahi Kasei Co., Ltd.) | 3.5 parts |
| Polyisocyanate hardening agent, Coronate HX (Nihon Polyurethane Co., Ltd.) | 1.5 parts |
| Methyl ethyl ketone | 20 parts |
| Toluene | 70 parts |

After the coating, the coated layer was dried for 30 seconds at 90° C., and the hardening was performed at 50° C. for 24 hours.

| Coating liquid for forming barrier layer; Thickness of 0.5 μm | |
| --- | --- |
| Poly(vinyl butyral) resin, Elex BX-1 (Sekisui Kagaku Co., Ltd.) | 4 parts |
| Taftex M-1913 (Asahi Kasei Co., Ltd.) | 4 parts |
| Polyisocyanate hardening agent, Coronate HX (Nihon Polyurethane Co., Ltd.) | 2 parts |
| Toluene | 50 parts |
| Methyl ethyl ketone | 40 parts |

After the coating, the coated layer was dried for 30 seconds at 70° C.

| Coating liquid for forming adhesion layer; Thickness of 0.3 μm | |
| --- | --- |
| Urethane-modified ethylene-ethyl acrylate copolymer, Hitec S6254B (Toho Kagaky Kogyo Co., Ltd.) | 8 parts |
| Polyacrylate copolymer, Julimer AT510 (Nihon Jun-yaky Co., Ltd.) | 2 parts |
| Water | 45 parts |
| Ethanol | 45 parts |

After the coating, the coated layer was dried for 30 seconds at 70° C. Thus transparent resin Transfer Foil 1 was prepared which was constituted by the releasing layer, the interlayer and the adhesive layer each having the above-described composition.

The transparent protective layer having the foregoing constitution was transferred from each of the transfer foils described in the example and the comparative example onto the image receiving member by using a heating roller heated at a surface temperature of 200° C. which had a diameter of 5 cm and a rubber hardness of 85, while applying a pressure of 150 kg/cm² for 1.2 second.

On the image receiving member on which the transparent resin layer was transferred from Transfer Foil 1, a UV-hardenable resin-containing coating liquid was coated by a gravure poll coater having specific patterns so that the coating amount was to be 20 g/m². The coated layer of the UV-hardenable resin-containing coating liquid was hardened under the following condition to form an UV-hardened protective layer.

| Light source for hardening: | |
| --- | --- |
| High pressure mercury lump of | 60 w/cm² |
| Irradiation distance: | 10 cm |
| Irradiation mode: | 3 cm/second by light scanning |
| UV-hardenable resin-containing coating liquid | |

-continued

| | |
|---|---|
| Bis(3,4-epoxy-6-methylhexylmethyl)adipate | 70 parts |
| Bisphenol A glycidyl ether | 10 parts |
| 1,4-butanediol glycidyl ether | 13 parts |
| Triarylsulfonium fluoroantimony | 7 parts |

The above mentioned processes for printing, image forming and transferring by the transferring foil to the card were performed by the card printing printer shown in FIG. 7.

Figure 8:
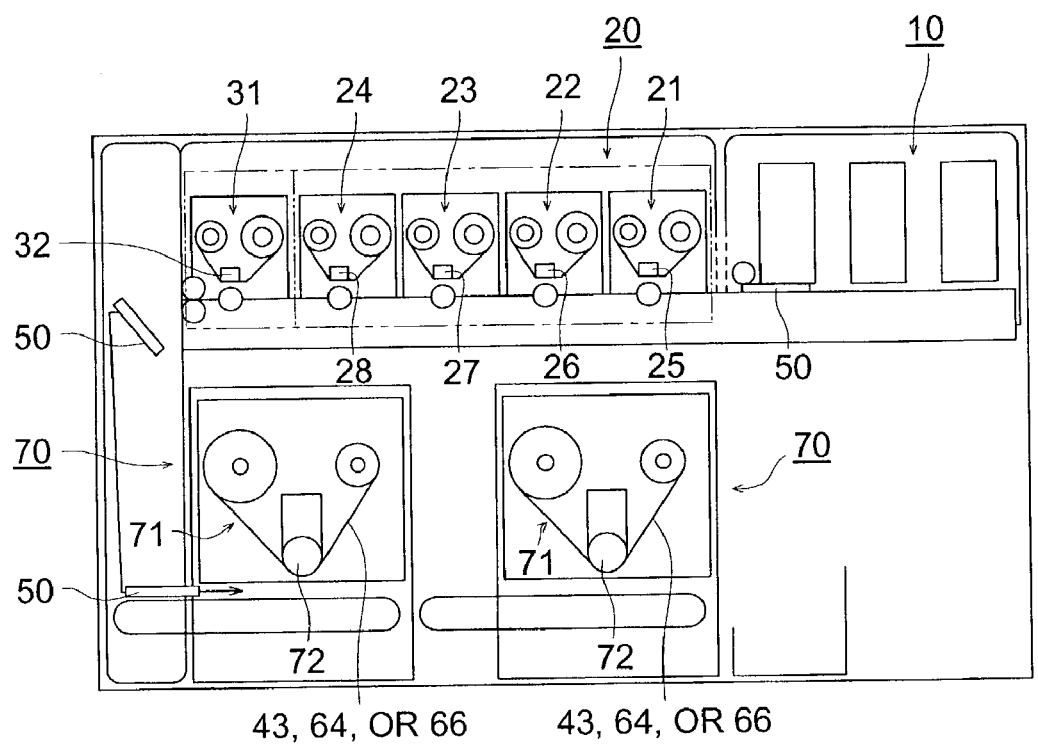
FIG. 8 shows a schematic drawing of the constitution of the IC card producing apparatus.

FIG. 8 shows a card printer for preparing the IC card. In the printer, a card substrate supplying section 10 and a information recording section 20 were arrange at the upper portion and a transparent protective layer and/or an optical variable device providing section and/or a resin layer providing section 70 were arranged at the lower portion. After that, a transparent protective layer and/or an optical variable device providing section and/or a resin layer providing section 70 are further arranged. Thus an image recorded card is prepared.

In the card substrate supplying section 10, for example, plural card substrates 50 previously cut in a shape of sheet leaf were stocked so that the side on which the portrait image to be formed was upward. The personal information of the card user was written on each of the card substrates. In this example, the card substrate was automatically supplied one by one from the card base supplying section 10 for designated timing.

In the information recording section, a yellow ribbon cassette 21, a magenta ribbon cassette 22, a cyan ribbon cassette 23 and a black ribbon cassette 24 were set and recording heads 25 to 28 were arranged corresponding to the position of the ribbon cassette. Images with gradation such as the portrait of the card user were recorded at the designated portion of the image receiving layer by the thermal transfer from the thermal transfer sheet such as the yellow ribbon, the magenta ribbon and the cyan ribbon while the card base 50 was moved.

Moreover, a ribbon cassette for character printing 31 and a recording head 32 were arranged, and the certification and discrimination information such as the name and the card issuing date were recorded by the thermal transfer from the thermal transfer sheet such as the character printing ribbon; thus the image recorded layer was formed. In the information recording section 20, the image information with gradation was formed on the image forming layer by imagewise heating. The condition of the recording head on the occasion of the image formation was a pressure of from 0.01 to 0.3 kg/cm$^2$ and a head temperature of from 50 to 500° C.

In the transparent protective layer and/or the optical variable device providing section and/or the resin layer providing section 70, a transfer foil cassette 71 was set and a thermal transfer cassette 72 is arranged corresponding to the position of the transfer foil cassette 71. The transfer layer of the optical variable device transfer foil 43 and/or that of the transparent protective layer transfer foil 64, that of the hardenable protective layer transfer foil 66 were transferred to provide the transferred optical variable device layer and/or the transferred transparent protective layer and the transferred hardened protective layer were provided. The temperature range in the image recording section 20 was from 60° C. to less than 300° C., in such the range, the image printing suitability, the resistivity of the bending and the conveying suitability in the printer of the card substrate were made suitable.

The printer according to an embodiment of the invention had at least one of the processes for printing, image transferring and hardenable resin layer transferring of the information recording section, and the stiffness of the card was lowered in the course of passing through the card printer.

The stiffness of the card is the repulsion force of the card itself generated when a certain load is applied to the card. When the stiffness of the card is high, the strength against to the bending stress is raised, but the stiffness is too high, the card is becomes fragile and tends to be easily broken. Consequently, a suitable stiffness is necessary.

It can be prevented that the card is made fragile and becomes easily breakable since the stiffness of the card is lowered in the course of passing through the printer. Accordingly, the card having a high resistivity against bending and high conveyance suitability through the printer can be obtained.

The lowering ratio of the stiffness was preferably from 3% to 20%. When the ratio was less than 3%, the effect of the stiffness lowering could not obtained and when the lowering ratio is more than 20%, the strength of the card itself was excessively lowered and the durability of the card was reduced.

In the character printing and transferring processes in the information recording section 20, the card was heated by a simple structure heating section at the card hopper of the card substrate supplying section 10. Consequently, the resistivity against bending and the conveyance suitability of the card substrate in the printing and transfer processes were made suitable.

The physical properties of the IC cards prepared by the card printer shown in FIG. 8 are described below.

<Measurement of Rupture Extensibility>

The rupture extensibility ratio in % of the resin was measured after standing of the light-hardened resin layer for 24 hours or more at a temperature of 23° C. and a relative humidity of 55%. The measurement was carried out by Tensilone General Use Tester RTA 100, manufactured by Orientech Co., Ltd., and the data processing was performed by Tensilone Mutifunction Data Processing Type MP-100/200S Ver. 44. The resin layer was fixed by air chucking. The cross head speed, the range and the loading each could be selected from 5 to 100 mm/minute, from 5 to 100% and from 0.1 to 500 kg, respectively. In an embodiment of the invention, the evaluation was performed under the condition of a cross head speed of 30 mm/minute, a range of 20% and a loading of 100 kg.

<Deformation of Pasted Sheet>

The deformation of pasted sheets was evaluated and classified into five ranks. Samples classified into Ranks 4 and 5 are on the level acceptable for the practical use.
  5: No deformation was observed on the sheet at all.
  4: The sheet was bended a little but no problem was raised in punching process.
  3: The sheet was bended and the card could not be punched out from the sheet.
  2: The sheet was considerably bended and folded.
  1: The sheet was considerably bended and folded so that the IC chip was broken.

<Suitability for Conveying by Printer>

The printing of character, formation of image and transferring from the transfer foil on the card were performed by the card printer shown in FIG. 8. Thus 10,000 cards were continuously processed. The conveying situation of the cards was investigated and classified into five ranks.

Samples classified into Ranks 4 and 5 were on the level acceptable for the practical use.

5: No card caused irregular conveying and no problem was raised on the printed image.
4: The number of the card which could not be suitably conveyed was less than 5, and no problem was on the printed image.
3: The number of the card which could not be suitably conveyed was from 5 to 50, and no problem was on the printed image.
2: The number of the card which could not be suitably conveyed was from 51 to 100, and a problem was raised on some of the printed image.
1: The card almost could not be conveyed.

<Durability of Card>

Figure 9:
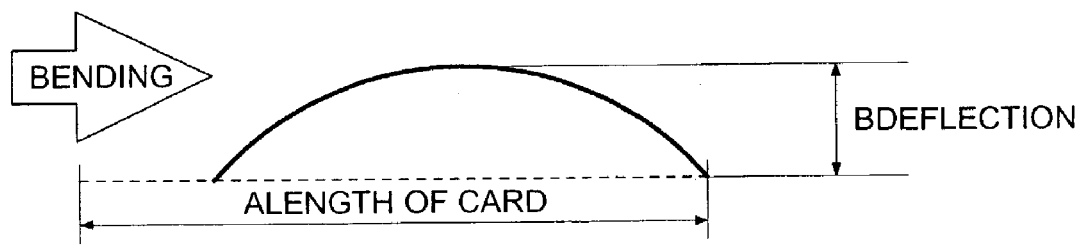
FIG. 9 shows the measuring condition of the durability of the card.

The personal certification card finished by the foregoing procedure was subjected to a bending test as shown in FIG. 9. The card was bended so that the bending amount in the direction of the shorter side was 35 mm and that in the direction of the longer side of the card was 15 mm. The bending in the shorter side direction and that in the longer side direction were each given every 125 times in a cycle of 30/minutes and 1000 times in total. Thereafter, the function of the IC was confirmed by a leader-writer available on the market and the samples were classified into three ranks. Thus obtained results are shown in Table 1.

A: No deformation occurred and there was no problem with the function of the IC.
B: No deformation occurred but the function of the IC was lost.
C: The card was folded and the function of the IC was lost.

The results are shown in Table 1.

TABLE 1

| Preparation Condition | | Back roller temperature | Preheating | Sheet storing condition | | Storage period until cutting | Paper, nonwoven fabric, SUS Spacer between sheets |
|---|---|---|---|---|---|---|---|
| *1 | *2 | (° C.) | (° C.) | *1 | *2 | (day) | |
| 20 | 20 | 80 | 100 | 120 | 30 | 25 | None |
| 20 | 20 | 80 | 100 | 60 | 30 | 27 | None |
| 20 | 30 | 65 | 100 | 15 | 30 | 34 | None |
| 20 | 35 | 65 | 100 | 10 | 40 | 22 | None |
| 20 | 20 | 80 | 100 | *3 | | 7 | None |
| 30 | 20 | 75 | 90 | *4 | | 9 | None |
| 18 | 25 | 65 | 95 | *5 | | 5 | None |

| Number of piled sheets | Punching edge | Days for hardening completion | Sheet deformation | Conveying suitability of card | Durability of card | Remarks |
|---|---|---|---|---|---|---|
| 400 | Hollow edge | 25 | 1 | 3 | C | Comp. |
| 400 | Hollow edge | 27 | 1 | 3 | B | Comp. |
| 400 | Hollow edge | 34 | 1 | 2 | C | Comp. |
| 400 | Hollow edge | 22 | 1 | 2 | B | Comp. |
| 400 | Hollow edge | 7 | 5 | 5 | A | Inv. |
| 400 | Hollow edge | 9 | 5 | 4 | A | Inv. |
| 400 | Hollow edge | 5 | 4 | 5 | A | Inv. |

TABLE 1-continued

*1; Temperature (° C.)
*2; Humidity (%)
Comp.; Comparative
Inv.; Inventive
*3; 23° C. at 55% for 3 hours, and then 40° C. at 80%
*4; 10° C. at 25% for 12 hours, and then 35° C. at 60%
*5; 30° C. at 80% for 3 hours, and then 50° C. at 90%

As is shown in the results, it is confirmed of the effects of an embodiment of the invention that the inventive examples are superior to the comparative samples in each of the evaluation terms.

According to an embodiment of the invention, the hardening speed of the adhesive agent can be raised and the complete hardening of the adhesive agent can be accelerated, the hardening and cutting process can be easily performed, the distortion is not occurred, the durability of the product after shaped as the card, and the mechanical conveyance suitability of the card can be made high by storing the pasted sheet under the specified temperature and humidity.

Further, according to an embodiment of the invention, the hardening speed of the adhesive agent can be raised, the complete hardening can be accelerated and the irregularity of the sheet surface can be disappeared since a space is formed between the sheets and the humidity is entered through the space formed by inserting an interrupt sheet.

Still further, according to an embodiment of the invention, the carbon dioxide gas can be driven out from the adhesive agent so as to inhibit the formation of the bulge.

Yet further, according to an embodiment of the invention, the pasted sheet can be easily cut without occurrence of distortion and the card thus produced has high durability and high machine conveyance suitability.

Yet further, according to an embodiment of the invention, the flatness of the sheet can be improved with out degradation of the coating ability of the adhesive agent, and the problems of lowering of the surface strength of the card after the hardening of the adhesive agent and the occurrence of burrs and whiskers can be solved.

Yet further, according to an embodiment of the invention, the producing efficiency can be raised.

What is claimed is:

1. A method of preparing an IC card, which comprises a first sheet material and a second sheet material and an adhesive agent layer between the first sheet material and the second sheet material, the adhesive agent layer having therein an IC module fixed with a moisture hardenable adhesive agent, the method comprising:
   a pasting step to paste the first sheet material and the second sheet material while providing the IC module between the first sheet material and the second sheet material with the moisture hardenable adhesive agent to form a pasted sheet;
   a first storing step to store the pasted sheet under a circumstance having a temperature of 10 to 30° C. and a relative humidity of 20 to 80% for 3 to 72 hours after pasting; and
   a second storing step to store the pasted sheet under a circumstance having a temperature of 20 to 50° C. and a relative humidity of 40 to 100% after the first storing step, wherein the temperature under the circumstance in the second storing step is made higher than that in the first storing step.

2. A method of preparing an IC card according to claim 1, wherein in the second storing step, the pasted sheet is stored under a circumstance having a temperature of 35 to 50° C. and a relative humidity of 60 to 100%.

3. A method of preparing an IC card according to claim 1, wherein a rupture extensibility of the moisture hardenable adhesive agent in a completely hardened state is 200 to 1000%.

4. A method of preparing an IC card according to claim 1, wherein in the pasting step, a plurality of pasted sheets are prepared, and at least in the first storing step or the second storing step, the plurality of pasted sheets are stacked together, and at least one kind of separating sheets, which are made of paper, non-woven fabric or metal, are interrupted between the stacked pasted sheets.

5. A method of preparing an IC card according to claim 4, wherein at least the separating sheets, which are made of paper or non-woven fabric, are interposed between the stacked pasted sheets at intervals of 1 to 10 of the pasted sheets.

6. A method of preparing an IC card according to claim 5, wherein each of the separating sheets comprises water in an amount of 0.001 to 50 g/m$^2$.

7. A method of preparing an IC card according to claim 4, wherein at least some of the separating sheets are made of metal, and are interrupted between the stacked sheets at intervals of 10 to 400 of the pasted sheets.

8. A method of preparing an IC card according to claim 7, wherein the metal is stainless, aluminum, or copper.

9. A method of preparing an IC card according to claim 7, wherein a load on each of the stacked pasted sheets is 2 to 250 kg/m$^2$.

10. A method of preparing an IC card according to claim 1, wherein the method further comprises a cutting step to cut the pasted sheet, and a rupture extensibility of the moisture hardenable adhesive agent is 50 to 500% when the cutting step is conducted.

11. A method of preparing an IC card according to claim 1, wherein the method further comprises a cutting step to cut the pasted sheet, and an elastic modulus of the moisture hardenable adhesive agent is 3 to 18 kgf/mm$^2$ when the cutting step is conducted.

12. A method of preparing an IC card according to claim 1, wherein the method further comprises a cutting step to cut the pasted sheet, and a peel-strength between the first sheet material and the adhesive agent layer and a peel-strength between the second sheet material and the adhesive agent layer are each not less than 1500 g per 25 mm width when the cutting step is conducted.

13. A method of preparing an IC card according to claim 1, wherein a total period of the first storing step and the second storing step is 1 to 60 days.

14. A method of preparing an IC card according to claim 1, wherein an elastic modulus of the moisture hardenable adhesive agent in completely hardened state is 5 to 50 kgf/mm$^2$.

15. A method of preparing an IC card according to claim 1, wherein a viscosity of the moisture hardenable adhesive agent is not more than 30,000 mps.

16. A method of preparing an IC card according to claim 1, wherein the moisture hardenable adhesive agent comprises a polymer containing a silane coupler or an urethane polymer having an isocyanate group in at least one end of the molecule.

17. A method of preparing an IC card according to claim 16, wherein the moisture hardenable adhesive agent comprises the urethane polymer having an isocyanate group in at least one end of the molecule.

18. A method of preparing an IC card according to claim 17, wherein the method further comprises a cutting step to cut the pasted sheet, and a proportion of number of reacted isocyanate groups to initial number of isocyanate groups in the moisture hardenable adhesive agent is 50 to 90% when the cutting step is conducted.

19. A method of preparing an IC card according to claim 1 further comprising
a cutting step to cut the pasted sheet into small pieces of the pasted sheet and
a punching step to punch the small pieces of the pasted sheet into a card form to prepare a card substrate.

20. A method of preparing an IC card according to claim 1, wherein the humidity in the second storing step is made higher than that in the first storing step.

21. A method of preparing an IC card, which comprises a first sheet material and a second sheet material and an adhesive agent layer between the first sheet material and the second sheet material, the adhesive agent layer having therein an IC module fixed with a moisture hardenable adhesive agent, the method comprising:
a pasting step to paste the first sheet material and the second sheet material while providing the IC module between the first sheet material and the second sheet material with the moisture hardenable adhesive agent to form a pasted sheet;
a first storing step to store the pasted sheet under a circumstance having a temperature of 10 to 30° C. and a relative humidity of 20 to 80% for 3 to 72 hours after pasting; and
a second storing step to store the pasted sheet under a circumstance having a temperature of 20 to 50° C. and a relative humidity of 40 to 100% after the first storing step; wherein in the pasting step, a plurality of pasted sheets are prepared, and at least in the first storing step or the second storing step, the plurality of pasted sheets are stacked together, and at least one kind of separating sheets, which are made of paper, non-woven fabric or metal, are interrupted between the stacked pasted sheets.

22. A method of preparing an IC card according to claim 21, wherein at least some of the separating sheets are made of metal, and are interrupted between the stacked sheets at intervals of 10 to 400 of the pasted sheets.

23. A method of preparing an IC card according to claim 22, wherein the metal is stainless, aluminum, or copper.

24. A method of preparing an IC card according to claim 22, wherein a load on each of the stacked pasted sheets is 2 to 250 kg/m$^2$.

* * * * *